United States Patent [19]

Yetter et al.

[11] Patent Number: 5,317,204

[45] Date of Patent: May 31, 1994

[54] MITIGATING THE ADVERSE EFFECTS OF CHARGE SHARING IN DYNAMIC LOGIC CIRCUITS

[75] Inventors: Jeffry D. Yetter, Ft. Collins; Robert H. Miller, Jr., Loveland, both of Colo.

[73] Assignee: Hewlett-Packard Company, Palo Alto, Calif.

[21] Appl. No.: 885,797

[22] Filed: May 19, 1992

Related U.S. Application Data

[63] Continuation-in-part of Ser. No. 684,720, Apr. 12, 1991, Pat. No. 5,208,490.

[51] Int. Cl.$^5$ ............................................ H03K 19/017
[52] U.S. Cl. ................................... 307/443; 307/452; 307/482.1
[58] Field of Search ............ 301/443, 451, 452, 482.1; 257/401

[56] References Cited

U.S. PATENT DOCUMENTS

| | | | |
|---|---|---|---|
| 4,570,084 | 2/1986 | Griffin et al. | 307/452 |
| 4,716,308 | 12/1987 | Matsuo et al. | 257/401 X |
| 5,015,882 | 5/1991 | Houston et al. | 307/452 |

FOREIGN PATENT DOCUMENTS 2264477  10/1990  Japan ................................. 257/401

OTHER PUBLICATIONS

Pretorius et al, "Charge Redistribution and Noise Margins in Domino CMOS Logic", *IEEE JSSC*, vol. CAS-33, No. 8, Aug. 1986, pp. 786-793.

Pretorius et al, "Latched Domino CMOS Logic", *IEEE JSSC*, vol. SC-21, No. 4, Aug. 1986 pp. 514-522.

*Primary Examiner*—David R. Hudspeth

[57] ABSTRACT

The adverse effects of charge sharing in dynamic logic gates are mitigated. The dynamic logic gates have an inverting buffer for providing a gate output, an arming mechanism for precharging the inverting buffer input, and ladder logic for receiving a gate input and for discharging the inverting buffer input to ground. The ladder logic comprises a plurality of transistors connected in ladder-like manner. In a first embodiment, the interstitial space between parallel transistor gates in the ladder logic is reduced so as to minimize parasitic capacitances. In a second embodiment, the parasitic capacitance of at a converging node defined by at least three converging transistors is minimized by disposing the transistor gates adjacent one another so that the transistors share a common interstitial space with a region of each transistor gate adjacent a region of each of the other remaining gates. In a third embodiment, a precharger is disposed to inject charge at the converging node when the inverting buffer input is precharged by the arming mechanism. Finally, in a fourth embodiment, the plurality of transistors in the ladder logic are connected in a ladder-like manner exclusively to thereby define a plurality of mutually exclusive paths to ground.

34 Claims, 16 Drawing Sheets

VECTOR INPUTS:
A=<AH,AL>
B=<BH,BL>
C=<CH,CL>

VECTOR OUTPUTS:
A⊕B=<(A⊕B)H ,(A⊕B)L>
A⊕B⊕C=<(A⊕B⊕C)H ,(A⊕B⊕C)L>

MITIGATING THE ADVERSE EFFECTS OF CHARGE SHARING IN DYNAMIC LOGIC CIRCUITS

The present invention is a continuation-in-part of "A FUNCTIONALLY COMPLETE FAMILY OF SELF-TIMED LOGIC CIRCUITS" by Jeffry Yetter, filed Apr. 12, 1991, having application Ser. No. 07/684,720 now U.S. Pat. No. 5,208,490, which is incorporated herein by reference.

BACKGROUND OF THE INVENTION

1. Field of the Invention

The present invention relates generally to dynamic logic in computers and, more particularly, to systems and methods for mitigating the effects of charge sharing in dynamic logic circuits, for example, mousetrap logic circuits.

2. Related Art

The central processing unit (CPU) in a computer must be designed to be extremely fast because it generally handles and ultimately supervises most of the interactions which occur within the computer. A critical factor which affects the speed at which a CPU can process data is the rate at which its arithmetic logic unit (ALU) can perform mathematical operations, such as addition, multiplication, and floating point manipulations. Typically, these mathematical operations are implemented via dedicated logic circuits within the CPU. These dedicated logic circuits must be fast, due to their frequent usage, so as not to undesirably slow the overall operation of and interaction with the CPU. Moreover, these dedicated logic circuits must be small in size so as to minimize the overall size of the CPU.

Traditionally, "static" logic gates have been utilized to construct logic circuits for performing mathematical operations. Static logic gates are those which can continuously perform logic operations so long as electrical power is available. In other words, static logic gates need no electrical precharge, or refresh, in order to properly perform logic operations. Static logic gates are functionally complete. They can directly perform both inverting and non-inverting functions. Further, they can be chained together, or cascaded, in several stages to collectively perform logic functions. However, static logic gates are undesirably slow individually and, when chained together to collectively perform a logic function, are even slower.

To achieve greater speed, "dynamic" logic gates were developed. Dynamic logic gates are those which require a periodic electrical precharge, or refresh, such as with a dynamic random access memory (DRAM), in order to maintain and properly perform its intended logic function. Once an electrical precharge supplied to a dynamic logic gate has been discharged by the dynamic logic gate, the dynamic logic gate can no longer perform another logic function until subsequently precharged again.

However, the use of conventional dynamic logic circuits in the construction of logic networks is problematic. Dynamic logic gates can be unreliable as a result of a "charge sharing" phenomenon. Charge sharing is a phenomenon which occurs after a node within the dynamic logic gate has been precharged. Essentially, the node acts as a storage capacitance ($C_s$). As logic evaluations are performed in the dynamic logic gate, the precharge on the node may be "shared" with other nodes as a result of gate switching in the logic. The other nodes act as parasitic capacitances ($C_p$), depleting the precharge. As a result, the precharge may be substantially diminished and thereby cause the dynamic logic gate to convey erroneous results or otherwise malfunction.

SUMMARY OF THE INVENTION

The present invention optimizes the performance and reliability of logic evaluations performed by dynamic logic gates by mitigating the effects of charge sharing. It has particular applicability to a family of self-timed dynamic logic gates known as "mousetrap" logic gates, but the novel principles are applicable to a wide variety of dynamic logic gates.

A first embodiment of the present invention has an inverting buffer means for providing a gate output, an arming means for precharging the inverting buffer input of the inverting buffer means, and a logic means for receiving a gate input and for discharging the inverting buffer input to ground. The logic means has a plurality of transistors connected in a ladder-like manner. In accordance with novel principles, the plurality of transistor gates are situated in close proximity so that parasitic capacitance is minimized, thereby reducing charge sharing.

A second embodiment of the present invention comprises, generally, an inverting buffer means for providing a gate output, an arming means for precharging the inverting buffer input of the inverting buffer means, and a logic means for receiving a gate input and for discharging the inverting buffer input to ground. Further, the logic means has a plurality of transistors connected in ladder-like manner and has at least three converging transistors which converge at a node. In accordance with novel principles, the transistors are configured on a substrate with a common interstitial space so that a region of each transistor gate is adjacent a region of each of the other remaining transistor gates. In a particular embodiment, the common interstitial space exhibits a T-like layout configuration. This novel configuration reduces parasitic capacitance, and consequently, minimizes charge sharing of the precharge disposed on the inverting buffer input.

A third embodiment of the present invention comprises an inverting buffer means, an arming means, logic means, and a precharging means. The inverting buffer means provides a gate output. The arming means precharges the inverting buffer input. The logic means receives a gate input and discharges the inverting buffer input to ground. Furthermore, the logic means has a plurality of transistors connected in ladder-like manner and has logic signal paths to ground which converge at a node. Finally, in accordance with a significant aspect of the third embodiment, the precharging means is disposed to precharge the node when the inverting buffer input is precharged by the arming means. Accordingly, the parasitic capacitance is reduced, and charge sharing of the precharge disposed on the inverting buffer input is minimized.

A fourth embodiment comprises an inverting buffer means for providing a gate output, an arming means for precharging the inverting buffer input of the inverting buffer means, and a logic means for receiving a gate input and for discharging the inverting buffer input to ground. In accordance with an important aspect of the fourth embodiment, the logic means has a plurality of transistors connected in ladder-like manner, exclusively, defining only a plurality of mutually exclusive paths to ground. This configuration reduces the parasitic capacitances and hence charge sharing in the logic means.

Further features and advantages of the present invention will become apparent to one skilled in the art upon examination of the following drawings and the detailed description. It is intended that any additional features and advantages be incorporated herein.

BRIEF DESCRIPTION OF THE DRAWINGS

The present invention, as defined in the claims, can be better understood with reference to the text and to the following drawings.

DETAILED DESCRIPTION OF THE PREFERRED EMBODIMENT

Table of Contents

Figure 1:
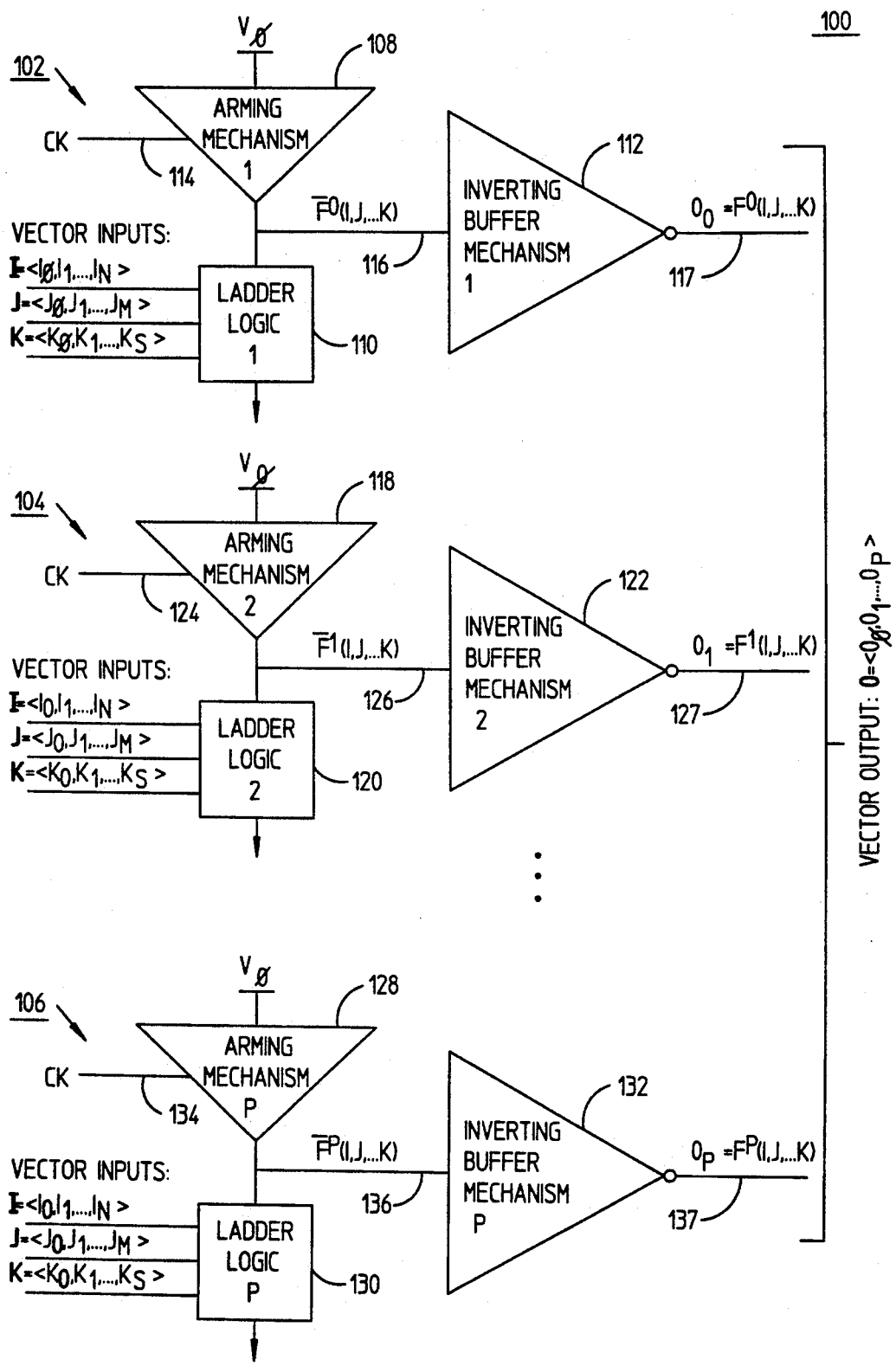
FIG. 1 illustrates a high level block diagram of a family of dynamic logic gates, called "mousetrap" logic gates.

I. Logic System
  A. Vector Logic
  B. Mousetrap Logic Gates
    1. Architecture
    2. Operation -continued Table of Contents 3. Inclusive OR Gate
    4. Add Predecoder Gate
    5. Carry Propagate Gate
    6. Shared Ladder Logic
    7. Exclusive OR Gates
II. Present Invention
  A. First Embodiment
  B. Second Embodiment
  C. Third Embodiment
  D. Fourth Embodiment

I. Logic System

The present invention is essentially directed to, among other things, enhancing the performance of dynamic logic gates, for example but not limited to, self-timed "mousetrap" logic gates, as well as logic blocks comprising a plurality of dynamic logic gates. Mousetrap logic gates are the subject matter focused upon in parent application Ser. No. 07/684,720 entitled "A FUNCTIONALLY COMPLETE FAMILY OF SELF-TIMED LOGIC CIRCUITS" filed Apr. 12, 1991. For a better understanding of the present invention, a brief discussion follows in regard to the fundamental principles of self-timed mousetrap logic gates.

A. Vector Logic

Typically, logic in a computer is encoded in binary fashion on a single logic path, which is oftentimes merely an electrical wire or semiconductor throughway. By definition, a high signal level, usually a voltage or current, indicates a high logic state (in programmer's language, a "1" or a "logic high"). Moreover, a low signal level indicates a low logic state (in programmer's language, a "0" or a "logic low").

By using mousetrap logic gates, "vector logic" may be implemented. Vector logic is a logic configuration where more than two valid logic states may be propagated through the logic gates in a computer. Unlike conventional binary logic having two valid logic states (high, low) defined by one logic path, the vector logic dedicates more than one logic path for each valid logic state and permits an invalid logic state.

For example, in accordance with one embodiment, in a vector logic system requiring two valid logic states, two logic paths are necessary. When both logic paths are at a logic low, i.e., "0,0", an invalid logic state exists by definition. Moreover, a logic high existing exclusively on either of the two logic paths, i.e., "1,0" or "0,1", corresponds with the two valid logic states of the vector logic system. Finally, the scenario when both logic paths are high, i.e., 1,1", is an undefined logic state in the vector logic system.

In a vector logic system requiring three logic states in accordance with another embodiment, three logic paths would be needed, and so on. In conclusion, in accordance with the foregoing embodiment, a vector logic system having n valid logic states and one invalid state comprises n logic paths.

Furthermore, encoding of vector logic states could be handled by defining a valid vector logic state by a logic high on more than one logic path, while still defining an invalid state when all paths exhibit a low logic signal. In other words, the vector logic states are not mutually exclusive.

For example, in a vector logic system using a pair of logic highs to define each valid vector logic state, the following logic scheme could be implemented. With three logic paths, "0,1,1" could designate a vector logic state 1, "1,0,1" a vector logic state 2, and "1,1,0" a vector logic state 3. With four logic paths, six valid vector logic states could be specified. Specifically, "0,0,1,1" could designate a vector logic state 1, "0,1,0,1" a vector logic state 2, "1,0,0,1" a vector logic state 3, "0,1,1,0" could designate a vector logic state 4, "1,0,1,0" a vector logic state 5, and "1,1,0,0" a vector logic state 6. With five logic paths up to ten valid vector logic states could be specified, and so on.

As another example, a vector logic system could be derived wherein three logic highs define each valid vector logic state. In conclusion, as is well known in the art, the above vector schemes can be summarized by a mathematical combination formula. The combination formula is as follows:

$$i = \binom{n}{m} = \frac{n!}{m!(n-m)!}$$

where variable n is the number of logic paths (vector components), variable m is the number of logic paths which define a valid vector logic state (i.e., the number of logic paths which must exhibit a logic high to specify a particular vector logic state), and variable i is the number of possible vector logic states.

B. Mousetrap Logic Gates

FIG. 1 illustrates a high level block diagram of the family of mousetrap logic gates. Mousetrap logic gates, described in detail hereinafter, can implement vector logic at high speed, are functionally complete, are self-timed, and do not suffer adverse logic reactions resulting from static hazards when chained in a sequence of stages.

As shown in FIG. 1, each input to the mousetrap logic gate 100 is a vector, denoted by vector inputs I, J, ..., K (hereinafter, vectors variables are in bold print). No limit exists as to the number of vector inputs I, J, ..., K. Further, each of vector inputs I, J, ..., K may be specified by any number of vector components, each vector component having a dedicated logic path denoted respectively in FIG. 1 by $I_0$-$I_N$, $J_0$-$J_M$, and $K_0$-$K_S$.

Essentially, each vector input specifies a vector logic state. As mentioned previously, an invalid vector logic state for any of the input vectors I, J, ..., K is present by definition when all of its corresponding vector components, respectively, $I_0$-$I_N$, $J_0$-$J_M$, and $K_0$-$K_S$, are at a logic low.

The output of the generic mousetrap logic gate 100 is also a vector, denoted by a vector output O. The vector output O is comprised of vector components $O_0$-$O_P$. The vector components $O_0$-$O_P$, are mutually exclusive and are independent functions of the vector inputs I, J, ..., K. Further, the vector components $O_0$-$O_P$ have dedicated mousetrap gate components 102-106, respectively, within the mousetrap logic gate 100. By definition, one and only one of $O_0$-$O_P$ is at a logic high at a any particular time.

Moreover, no limit exists in regard to the number of vector components $O_0$-$O_P$ which can be associated with the output vector O. The number of vector components $O_0$-$O_P$, and thus mousetrap gate components 102-106 depends upon the logic function to be performed on the vector inputs individually or as a whole, the number of desired vector output components, as well as other considerations with respect to the logical purpose of the mousetrap logic gate 100.

1, Architecture

With reference to FIG. 1, each mousetrap gate component 102-106 of the mousetrap logic gate 100 comprises an arming mechanism 108, ladder logic 110, and an inverting buffer mechanism 112. The arming mechanism 108 is a precharging means, or energizing means, for arming and resetting the mousetrap logic gate 100.

The arming mechanism 108 essentially serves as a switch to thereby selectively impose a voltage $V_0$ defining a logic state on a line 116 upon excitation by a clock signal (high or low) on line 114. As known in the art, any type of switching element or buffer for selectively applying voltage based upon a clock signal can be used. Furthermore, when the logic of a computer system is based upon current levels, rather than voltage levels, then the arming mechanism 108 could be a switchable current source, which is also well known in the art. Any embodiment serving the described switching function as the arming mechanism 108 is intended to be incorporated herein.

The ladder logic 110 is designed to perform a logic function on the vector inputs I, J, ..., K. The ladder logic 110 corresponding to each mousetrap gate component 102-106 may vary depending upon the purpose of each mousetrap gate component 102-106. In the preferred embodiment, the ladder logic 110 is essentially a combination of simple logic gates, for example, logic OR gates and/or logic AND gates, which are connected in series and/or in parallel. It should be noted that the ladder logic 110 is configured so that one and only one of the vector output components $O_0$-$O_P$ is at a logic high at any sampling of a valid vector output O. For a better understanding of the family of mousetrap logic gates, specific implementations of the ladder logic 110 are described below and illustrated in FIGS. 2-5.

The ladder logic 110 must operate at high speed because it resides in the critical logic path, unlike the arming mechanism 108 which initially acts by arming the mousetrap gate component, but then sits temporarily dormant while data actually flows through the mousetrap gate component, i.e., through the critical logic path. Furthermore, because the ladder logic 110 resides in the critical logic path which is essentially where the logical intelligence is positioned, a plurality of logic gates are generally required to implement the desired logic functions.

Also residing in the logic path is the inverting buffer mechanism 112. The inverting buffer mechanism 112 primarily serves as an inverter because in order to provide complete logic functionality in the mousetrap gate 100, it is necessary to have an inversion function in the critical logic path. Moreover, the inverting buffer mechanism 112 provides gain to the signal residing on line 114 and provides isolation between other potential stages of mousetrap gate components similar to the mousetrap logic gate components 102-106 of FIG. 1. The inverting buffer mechanism 112 is characterized by a high input impedance and low output impedance. Any buffer embodiment serving the described function as the buffer mechanism 112 is intended to be incorporated herein.

Furthermore, worth noting is that the arming mechanism 108, the ladder logic 110, and the inverting buffer mechanism 112 could in some implementations all reside on a single integrated circuit (IC), for example, an application specific integrated circuit (ASIC) or microprocessor chip.

2. Operation

The operation of the mousetrap logic gate 100 is described below at a high conceptual level in regard to only the mousetrap gate component 102 for simplicity. The narrowing of the present discussion is well grounded, because the various mousetrap gate components 102–106 are essentially redundant with the exception of their corresponding ladder logic functions implemented by ladder logics 110, 120, and 130. Consequently, the following discussion is equally applicable to the remaining mousetrap gate components 104 and 106.

In operation, upon excitation by a clock CK on the line 114, the arming mechanism 108 pulls up, or drives, the output 116 of the ladder logic 110 to a logic high. Concurrently, the arming mechanism 108 pulls the input at line 114 to the inverting buffer mechanism 112 to a logic high. Consequently, the corresponding vector component $O_0$ on a line 117 is maintained at a logic low, defined as an invalid state. In the foregoing initial condition, the mousetrap logic gate 100 can be analogized as a "mousetrap," in the traditional sense of the word, which has been set and which is waiting to be triggered by the vector inputs I, J, ..., K.

The mousetrap logic gate 100 will remain in the armed predicament with the vector component $O_0$ in the invalid state, until being triggered by the ladder logic 110. The mousetrap logic gate 100 is triggered upon receiving enough valid vector inputs I, J, ..., K to definitively determine the correct state of the vector component $O_0$ on the line 117. In some designs of the ladder logic 110, not all of the vector inputs will need to be considered in order to produce an output signal on line 116, and hence, on line 117. The number of vector inputs I, J, ..., K needed to make the definitive determination of the output state and also the timing of the determination is defined by the content and configuration of the simple logic gates within the ladder logic 110.

After the vector component $O_0$ on line 117 is derived, it is passed onto the next stage (not shown) of logic. The mousetrap logic gate component 102 will not perform any further function until being reset, or re-armed, or refreshed, by the arming mechanism 108. In a sense, the timing from mousetrap gate component to mousetrap gate component as well as gate to gate depends upon the encoded data itself. In other words, the mousetrap gate components are "self-timed."

Mousetrap logic gates directly perform inverting and non-inverting functions. Consequently, in contrast to conventional dynamic logic gates, mousetrap logic gates can perform multiplication and addition, which require logic inversions, at extremely high speeds.

Finally, it should be noted that the family of mousetrap logic gates 100 can be connected in electrical series, or cascaded, to derive a combinational logic gate which will perform logic functions as a whole. Thus, a mousetrap gate component, comprising an arming mechanism, ladder logic, and an inverting buffer mechanism, can be conceptualized as the smallest subpart of a mousetrap logic gate. Moreover, various mousetrap gate components can be connected in series and/or in parallel to derive a multitude of logic gates.

However, when mousetrap logic gates are chained together in long chains (perhaps, greater than two or three mousetrap gate components in series), precharging of the chains might require an undesirable lengthy amount of time. The reason is that mousetrap gate components will not be able to pull their output low (invalid) until their input is pulled low. The result is that the mousetrap gate components will charge in sequence from the first to the last in the chain, thereby undesirably slowing the precharge of the overall chain. Hence, a way is needed to cause the mousetrap gate components of a chain to precharge in parallel, not in sequence.

Parallel precharging can be accomplished several different ways. A preferred way is to provide a clock triggered n-channel MOSFET to disable the ladder logics 110, 120, and 130 of FIG. 1 during the precharging of the mousetrap gate components. In other words, a push-pull situation is implemented. The arming mechanism of a mousetrap gate component pulls (precharges) the input to the inverting buffer mechanism high, while the inserted n-channel MOSFET pulls the ladder logic low.

It should be noted that the n-channel MOSFET slightly slows the operation of the mousetrap gate component. However, it should be emphasized that the n-channel MOSFET need not be implemented for every mousetrap gate component. It need only be inserted every second or third mousetrap gate component in series. Moreover, in certain logic circuits, such as multiplication, the parallelism of the logic operation may be exploited to reduce the number of requisite n-channel MOSFETs.

The foregoing embodiment for providing parallel precharging has advantages. It requires little additional power dissipation. Moreover, it can, if desired, be uniformly applied to all mousetrap gate components for simplicity.

Another preferred way of providing for parallel precharging of mousetrap gate components chained in series is to periodically insert a mousetrap AND gate in the critical logic path. The mousetrap AND gate has the following inputs: (1) an output vector component from a preceding mousetrap gate component and (2) the precharge clock. The output of the mousetrap AND gate is the input to the next in series mousetrap gate component.

3. Inclusive OR Gate

Figure 2:
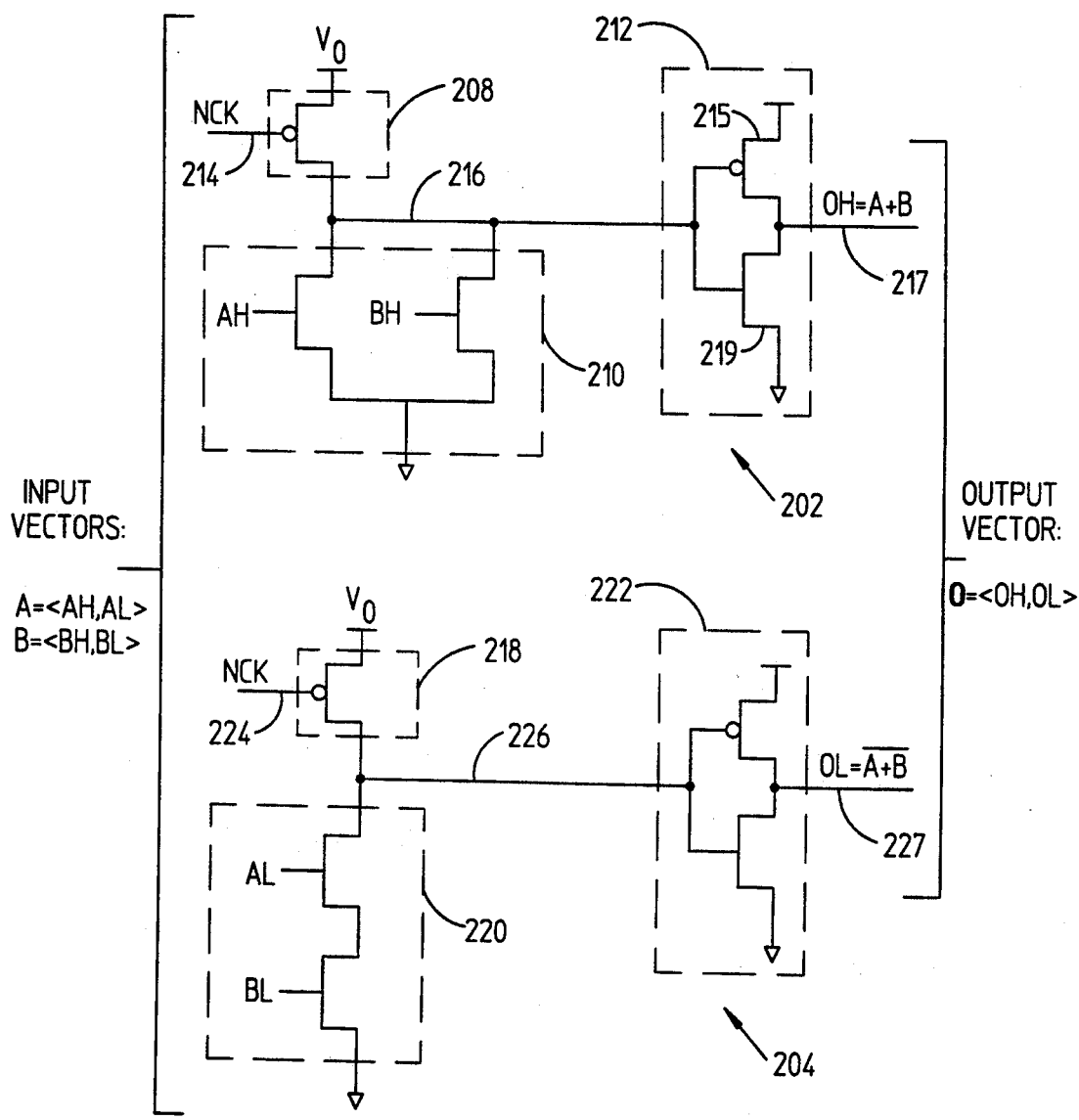
FIG. 2 illustrates a low level block diagram of a two-input inclusive OR mousetrap logic gate in accordance with FIG. 1.

FIG. 2 shows a low level block diagram of an example of a two-input inclusive OR mousetrap logic gate 200 in accordance with FIG. 1. The inclusive OR mousetrap logic gate 200 can be used in a vector logic system having two logic states and one invalid logic state.

As shown, the inclusive OR mousetrap logic gate 200 has two mousetrap gate components 202 and 204. The mousetrap gate component 202 comprises an arming mechanism 208, ladder logic 210, and an inverting buffer mechanism 212. The mousetrap gate component 204 comprises an arming mechanism 218, ladder logic 220, and an inverting buffer mechanism 222. Note the similarity of reference numerals with regard to FIG. 1, as well as with the other figures to follow.

The inclusive OR mousetrap logic gate 200 and specifically, the arming mechanisms 208 and 218, is armed by command of a clock NCK ("N" denotes active at logic low) on respective lines 214 and 224. In the preferred embodiments, the arming mechanisms 208 and 218 are p-channel metal-oxide-semiconductor field-effect transistors (MOSFET), as shown in FIG. 2, which are well known in the art and are commercially available. N-channel MOSFETs could be used instead of p-channel MOSFETs; however, the clocking obviously would be diametrically opposite.

With reference to FIG. 2, the MOSFETs comprising the arming mechanisms 208 and 218 essentially serve as switches to thereby impose a voltage V0 on respective lines 216 and 226 upon excitation by a low clock NCK signal on respective lines 214 and 224. As further known in the art, any type of switching element for voltage can be used.

Additionally, in the preferred embodiments, the simple logic in the ladder logics 210 and 220 is implemented with n-channel MOSFETs, as shown. The rationale for using n-channel MOSFETs is as follows. N-channel MOSFETs have superior drive capabilities, space requirements, and load specifications, than comparable p-channel MOSFETs. A typical n-channel MOSFET can generally switch approximately fifty percent faster than a comparable p-channel MOSFET having similar specifications.

Furthermore, in the preferred embodiments, the inverting buffer mechanisms 212 and 222 are static CMOSFET inverters, as shown in FIG. 2, which are well known in the art and are commercially available. A CMOSFET inverter is utilized for several reasons. As stated previously, an inversion must take place in the critical logic path in order to provide functional completeness. The inversion which must take place in the critical path can be accomplished by cleverly manipulating the design (gain) of a conventional CMOSFET inverter, which comprises both a p-channel MOSFET pull-up 215 and an n-channel MOSFET pull-down 219. In other words, because of the known existence of a monotonic progression, the ratio of the widths of the MOSFET gates can be designed to favor switching in one direction [i.e., either high (1) to low (0) or low (0) to high(1)], at the expense of the other direction.

Specifically, in the preferred CMOSFET inverter, the gate width of the constituent p-channel MOSFET 215 is made wider than the gate width of the constituent n-channel MOSFET 219. Consequently, the CMOSFET inverter output switches very quickly from a logic low (0; the armed state of the mousetrap) to a logic high (1; the unarmed state of the mousetrap). The speed of the CMOSFET inverter output switching from a logic high to a logic low does not matter because the mousetrap gate 200 is precharged during this time period. Hence, the mousetrap logic gate 200 can be constructed to exhibit superior performance and size specifications in one direction, to thereby tremendously increase the speed of data transfer and reduce the size specifications of the mousetrap logic gate 200.

With respect to operation, a truth table for the inclusive OR mousetrap logic gate 200 is set forth in Table A hereinafter.

TABLE A

| a | b | O | AH | AL | BH | BL | OH | OL |
|---|---|---|----|----|----|----|----|----|
| inv | inv | inv | 0 | 0 | 0 | 0 | 0 | 0 |
| inv | 0 | inv | 0 | 0 | 0 | 1 | 0 | 0 |
| 0 | inv | inv | 0 | 1 | 0 | 0 | 0 | 0 |
| 1 | x | 1 | 1 | 0 | x | x | 1 | 0 |

TABLE A-continued

| a | b | O | AH | AL | BH | BL | OH | OL |
|---|---|---|----|----|----|----|----|----|
| x | 1 | 1 | x | x | 1 | 0 | 1 | 0 |

In the above Table A, "x" denotes a an irrelevant or "don't care" situation; "inv" denotes an invalid logic state; "1" denotes a high logic state; and "0" denotes a low logic state.

As indicated in Table A and shown in FIG. 2, a vector input a and a vector input b are operated upon by the inclusive OR mousetrap logic gate 200 to derive a vector output O. For discussion purposes, it is worth noting that vector input a, vector input b, and vector output O could correspond respectively with vector input I, vector input J, and vector output O of FIG. 1.

Vector input a specifies a vector logic state defined by two vector components AH and AL. Vector input b specifies a vector logic state defined by two other vector components BH and BL. Vector output O specifies a vector logic state defined by two vector components OH and OL, which collectively describe the inclusive disjunction (OR function) of vector inputs a and b. In vector notation, as shown, $a = <AH,AL>$; $b = <BH,BL>$; and $O = <OH,OL> = a+b$.

4. Add Predecoder Gate

Figure 3:
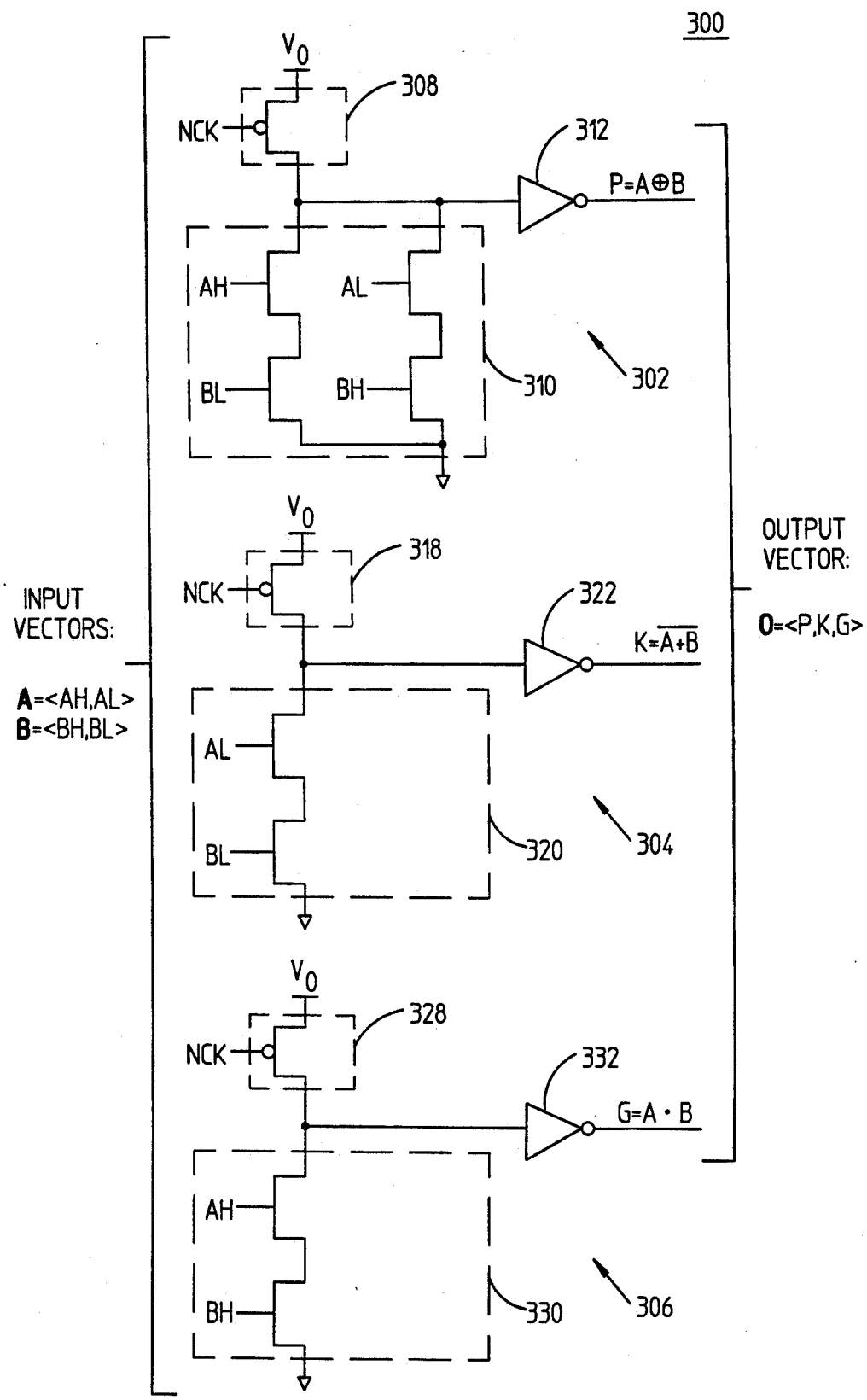
FIG. 3 illustrates a low level block diagram of a two-input add predecoder mousetrap logic gate in accordance with FIG. 1.

FIG. 3 shows a low level block diagram of a two-input add predecoder mousetrap logic gate 300 in accordance with FIG. 1. Well known in the art, a predecoder is logic primarily used in the arithmetic logic unit (ALU) to perform arithmetic functions, especially addition. Generally, a predecoder aids in parallel processing and facilitates control of a carry bit path.

As shown, the predecoder 300 has three mousetrap gate components 302–306. Respectively, the three mousetrap gates 302–306 comprise the following: (1) an arming mechanism 308, ladder logic 310, and a buffer 312; (2) an arming mechanism 318, ladder logic 320, and a buffer 322; and (3) an arming mechanism 328, ladder logic 330, and a buffer 332.

A truth table describing the operation of the add predecoder logic gate 300 is set forth in Table B hereinafter.

TABLE B

| a | b | O | AH | AL | BH | BL | P | K | G |
|---|---|---|----|----|----|----|---|---|---|
| inv | x | inv | 0 | 0 | x | x | 0 | 0 | 0 |
| x | inv | inv | x | x | 0 | 0 | 0 | 0 | 0 |
| 0 | 0 | kill | 0 | 1 | 0 | 1 | 0 | 1 | 0 |
| 0 | 1 | prop | 0 | 1 | 1 | 0 | 1 | 0 | 0 |
| 1 | 0 | prop | 1 | 0 | 0 | 1 | 1 | 0 | 0 |
| 1 | 1 | gen | 1 | 0 | 1 | 0 | 0 | 0 | 1 |

Similar to the inclusive OR mousetrap logic gate 200 of FIG. 2, vector input a specifies a vector logic state defined by two vector components AH and AL. Vector input b specifies a vector logic state defined by two other vector components BH and BL. However, in contrast to the mousetrap logic gate of FIG. 2, vector output O specifies a vector logic state defined by three vector components P, K, and G, discussed in detail below. In vector notation, as shown, $a = <AH,AL>$; $b = <BH,BL>$; and $O = <P,K,G>$.

Conventional predecoders are usually designed so that the output indicates only one of two logic states. In many implementations, the conventional predecoder indicates either that the carry should be "propagated"

(designated by "P") or that the carry bit should be "killed" (designated by "K"). In other implementations, the predecoder indicates either that the carry should be "propagated" or that the carry bit should be "generated" (designated by "G").

As noted in Table B, the vector output O can indicate any of four logic states: an invalid state and three valid states, namely, kill, propagate, or generate.

Furthermore, the add predecoder logic gate 300 must perform an exclusive OR function as part of the overall predecoder function. Conventionally, dynamic logic gates could not implement the exclusive OR function because static hazards would cause logic errors. Static hazards occur in combinational logic configurations because of propagation delays. The mousetrap logic gates are not adversely affected by static hazards, because of self-timing. No valid vector component output is present unless all the vector inputs, needed to definitively determine the output of the ladder logic, are valid as indicated in Table B.

5. Carry Propagate Gate

Figure 4:
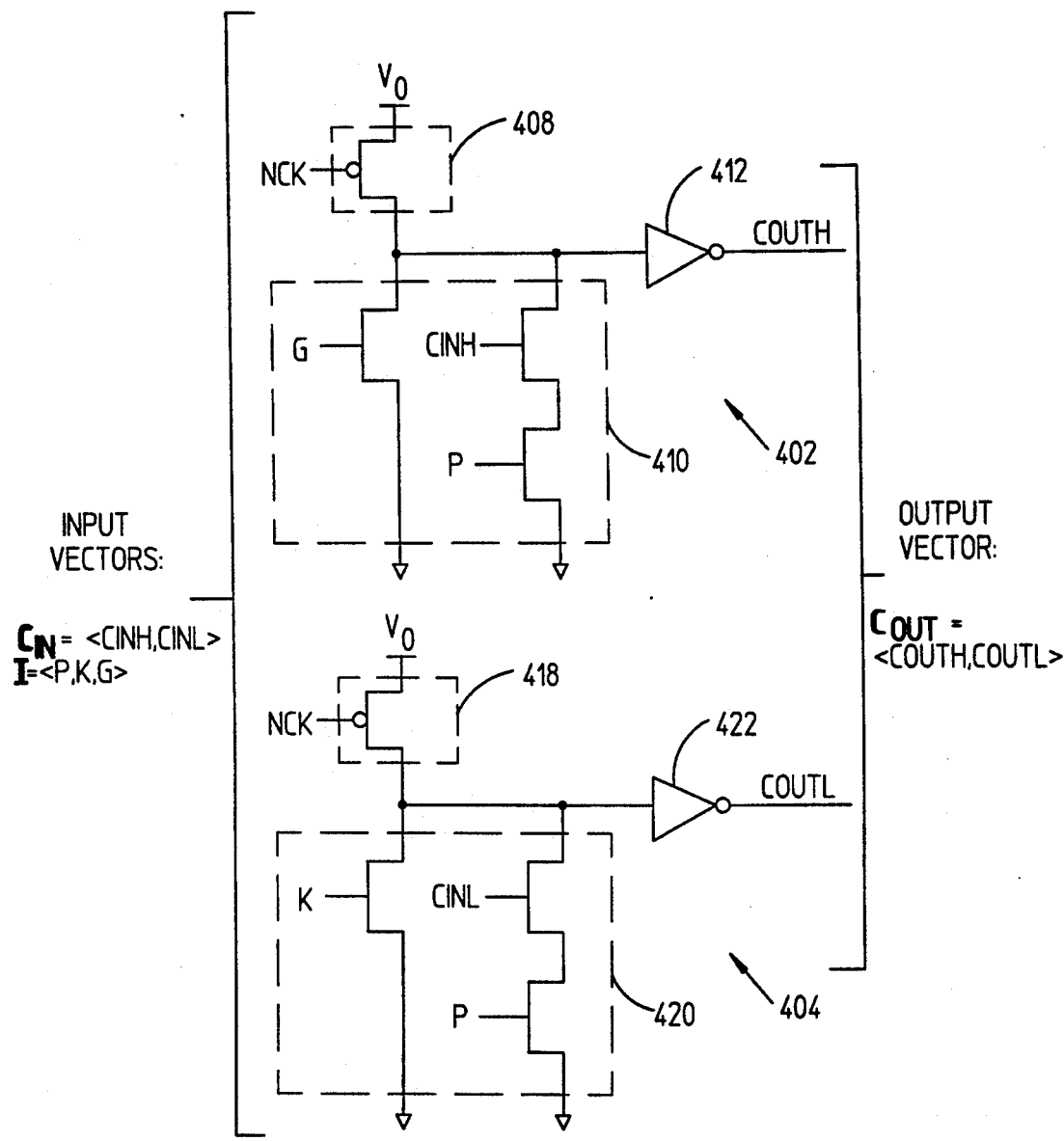
FIG. 4 illustrates a low level block diagram of a carry propagate mousetrap logic gate in accordance with FIG. 1 and for use series with the add predecoder mousetrap logic gate of FIG. 3.

FIG. 4 shows a low level block diagram of a carry propagate gate 400 in accordance with FIG. 1. Well known in the art, a carry propagate logic gate is oftentimes used in series with an add predecoder logic gate, as discussed previously, in order to control a carry bit path in an ALU. Specifically, the carry propagate gate 400 functions in series with the add predecoder logic gate 300 in the preferred embodiment to provide a high performance carry bit path.

The carry propagate gate 400 has two mousetrap gate components 402 and 404. The mousetrap gate component 402 comprises an arming mechanism 408, ladder logic 410, and an inverting buffer mechanism 412. The mousetrap gate component 404 comprises an arming mechanism 418, ladder logic 420, and an inverting buffer mechanism 422.

To further clarify the functionality of the carry propagate gate 400, a truth table for the carry propagate gate 400 is set forth in Table C hereinafter.

6. Shared Ladder Logic

Figure 5A:
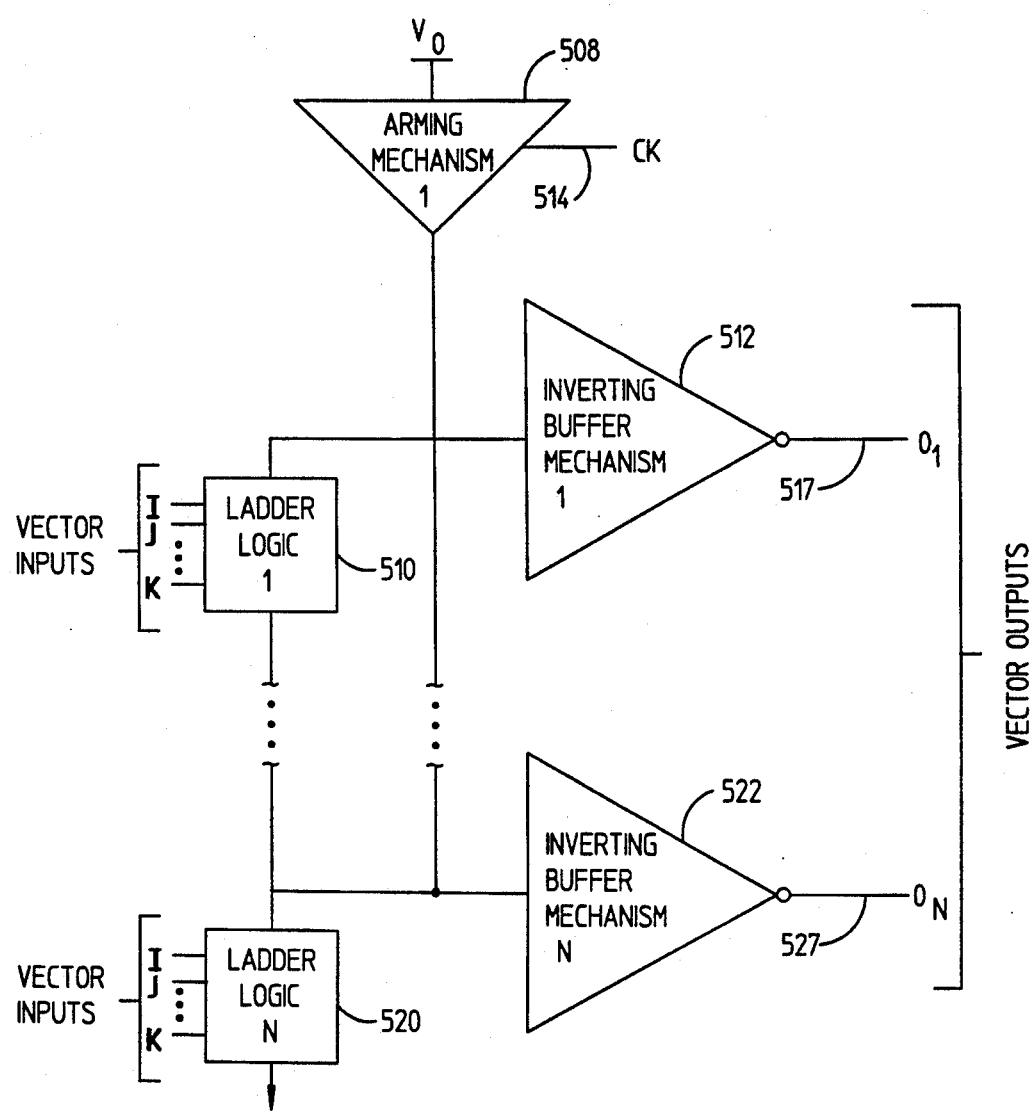
FIG. 5A illustrates a high level block diagram of a mousetrap logic gate having shared ladder logics.

FIG. 5A shows a high level block diagram of an embodiment of a mousetrap logic gate wherein the ladder logics 510–520 of any number n of mousetrap gate components have been combined in a single mousetrap logic gate 500A. The mousetrap logic gate 500A is input with a plurality of vectors I, J, . . . , K, and/or parts thereof. In turn, the gate 500A outputs a plurality of vector output components $<O_1\text{-}O_n>$, which can define vectors and/or partial vectors.

Essentially, the logic function which generated the vector component output $<O_n>$ is a subset of all logic functions deriving vector component outputs $<O_1>$ through $<O_{n-1}>$. More specifically, the vector component output $<O_1>$ is determined by ladder logics 510, 520, while the vector component output $<O_n>$ is determined by only ladder logic 520. As is obvious from FIG. 5A, this configuration saves hardware and cost. More outputs are derived with less ladder logic.

7. Exclusive OR Gates

Figure 5B:
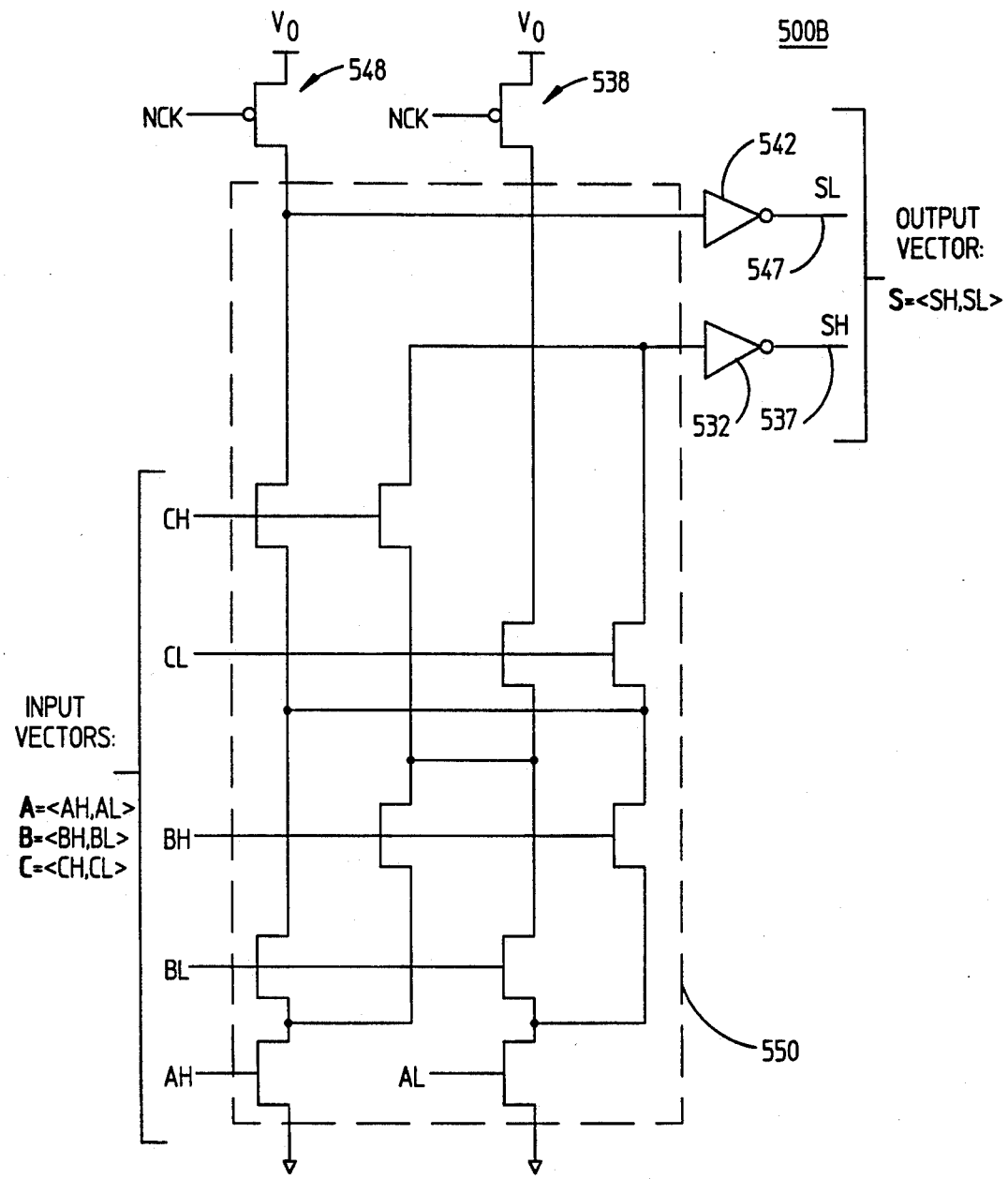
FIG. 5B illustrates a low level block diagram of a three-input exclusive OR mousetrap logic gate in accordance with FIG. 5A.

A specific example of FIG. 5A is illustrated in FIG. 5B. FIG. 5B shows a low level block diagram of a three-input exclusive-OR (XOR) mousetrap logic gate 500B. The exclusive OR mousetrap logic gate 500B can be used for high speed sum generation in either a full or half adder and does not suffer from any adverse effects from static hazards. Sum generation logic gates are well known in the art. They are especially useful in adder and multiplier logic circuits.

The exclusive OR logic gate 500 has two mousetrap gate components, having respective arming mechanisms 538 and 548 as well as inverting buffer mechanisms 532 and 542. However, as shown by a phantom block 550, the ladder logic associated with each of the two mousetrap gate components is not separated completely in hardware, but remains mutually exclusive in a logic sense. Hence, as a general proposition, because the ladder logic in each mousetrap gate component of a mousetrap logic gate uses the same type of gates, namely, n-channel MOSFETs, sometimes their logic functions can share the same hardware, thereby resulting in a less number of total gates and a reduction in utilized computer real estate.

A truth table indicating the operation of the exclusive OR logic gate 500B is set forth in Table D hereinafter.

TABLE C

| I | CIN | COUT | P | K | G | CINH | CINL | COUTH | COUTL |
|---|---|---|---|---|---|---|---|---|---|
| inv | x | inv | 0 | 0 | 0 | x | x | 0 | 0 |
| x | inv | inv | x | x | x | 0 | 0 | 0 | 0 |
| kill | x | 0 | 0 | 1 | 0 | x | x | 0 | 1 |
| prop | 0 | 0 | 1 | 0 | 0 | 0 | 1 | 0 | 1 |
| prop | 1 | 1 | 1 | 0 | 0 | 1 | 0 | 1 | 0 |
| gen | x | 1 | 0 | 0 | 1 | x | x | 1 | 0 |

TABLE D

| a | b | c | s | AH | AL | BH | BL | CH | CL | SH | SL |
|---|---|---|---|---|---|---|---|---|---|---|---|
| inv | x | x | inv | 0 | 0 | x | x | x | x | 0 | 0 |
| x | inv | x | inv | x | x | 0 | 0 | x | x | 0 | 0 |
| x | x | inv | inv | x | x | x | x | 0 | 0 | 0 | 0 |
| 0 | 0 | 0 | 0 | 0 | 1 | 0 | 1 | 0 | 1 | 0 | 1 |
| 0 | 0 | 1 | 1 | 0 | 1 | 0 | 1 | 1 | 0 | 1 | 0 |
| 0 | 1 | 0 | 1 | 0 | 1 | 1 | 0 | 0 | 1 | 1 | 0 |
| 0 | 1 | 1 | 0 | 0 | 1 | 1 | 0 | 1 | 0 | 0 | 1 |
| 1 | 0 | 0 | 1 | 1 | 0 | 0 | 1 | 0 | 1 | 1 | 0 |
| 1 | 0 | 1 | 0 | 1 | 0 | 0 | 1 | 1 | 0 | 0 | 1 |
| 1 | 1 | 0 | 0 | 1 | 0 | 1 | 0 | 0 | 1 | 0 | 1 |
| 1 | 1 | 1 | 1 | 1 | 0 | 1 | 0 | 1 | 0 | 1 | 0 |

As indicated in Table D and shown in FIG. 5B, vector input a specifies a vector logic state defined by two vector components AH and AL. Vector input b specifies a vector logic state defined by two other vector components BH and BL. Vector input c specifies a vector logic state defined by two vector components CH and CL. Furthermore, vector output s specifies a vector logic state defined by two outputs SH and SL. In vector notation, as shown, a=<AH,AL>; b=<BH,BL>; c=<CH,CL>; and s=<SH,SL>.

Figure 5C:
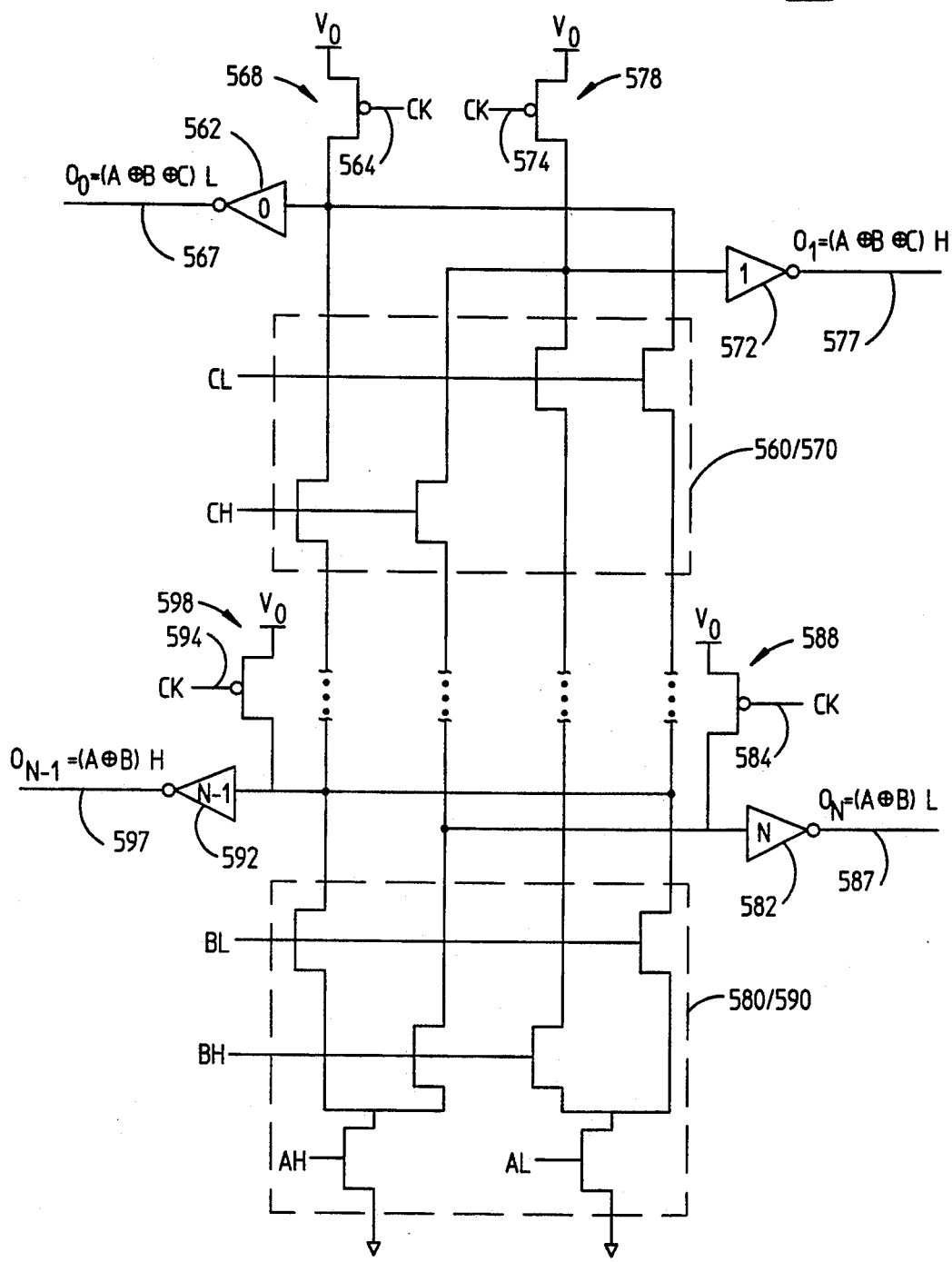
FIG. 5C illustrates a low level block diagram of a combined two-input/three-input exclusive OR mousetrap logic gate in accordance with FIG. 5A.

Another specific example of FIG. 5A is illustrated in FIG. 5C. FIG. 5C shows a low level block diagram of a three-input exclusive-OR (XOR) logic gate combined with a two-input exclusive-OR (XOR) logic gate. The input vectors are a=<AH, AL>, b=<BH, BL>, and c=<CH, CL>.

Furthermore, the output vectors are the XOR logic function of vectors a and b, defined by vector component outputs <$O_0$, $O_1$>, as well as the XOR logic function of vectors a, b, and c, defined by vector component outputs <$O_{n-1}$, $O_n$>. The vector component outputs <$O_0$, $O_1$> are determined by ladder logics 560–590, while the vector component outputs <$O_{n-1}$, $O_n$> are determined by only ladder logics 580, 590. Worth noting is that FIG. 5C illustrates a mousetrap logic gate having multiple vector inputs and multiple vector outputs.

III. Present Invention

A. First Embodiment

Figure 6:
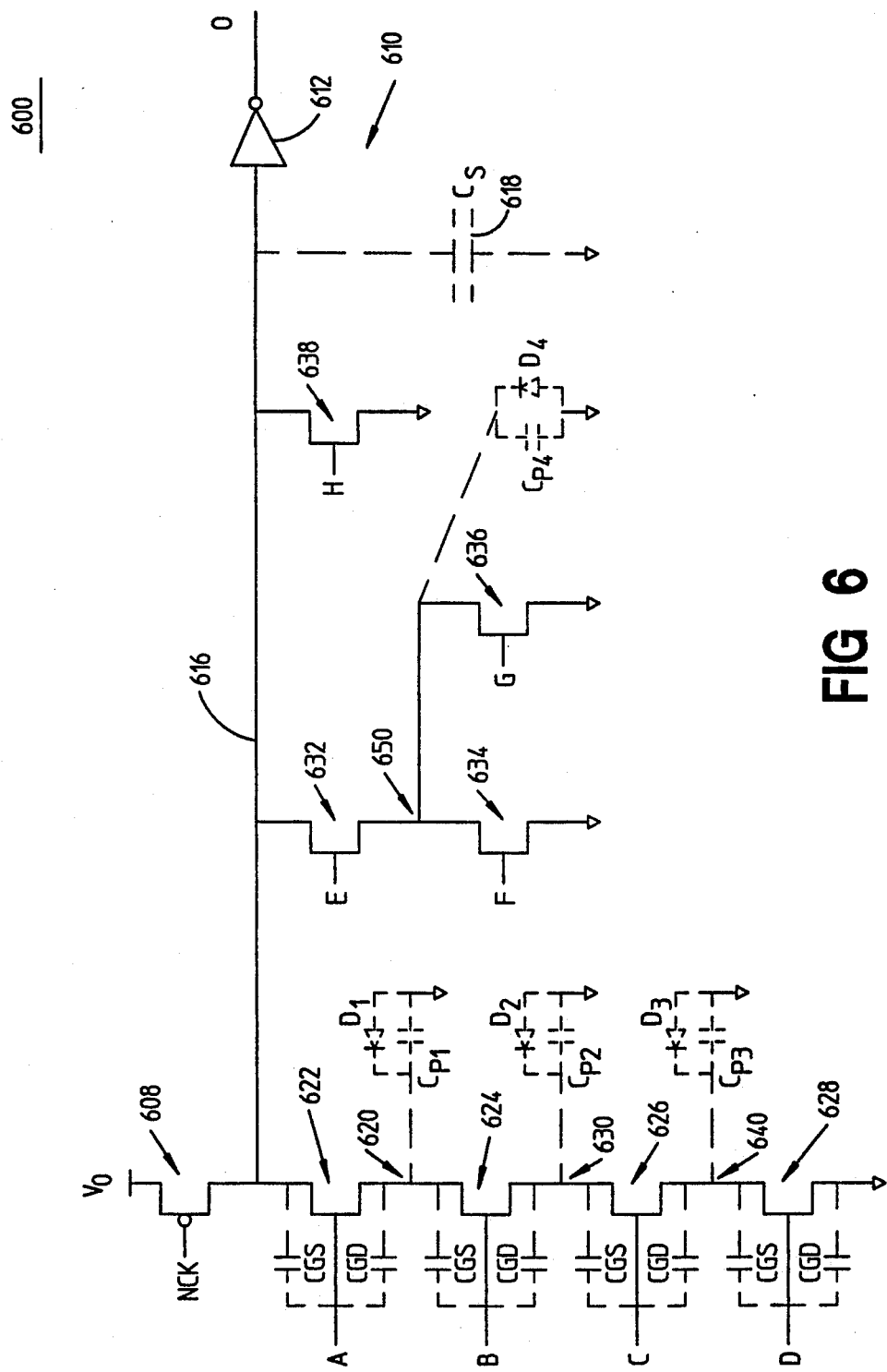
FIG. 6 illustrates a low level block diagram of a storage capacitance $C_s$ and parasitic capacitances $C_p$ exhibited at various nodes of a mousetrap logic gate constructed in accordance with FIG. 1.

The adverse effects of the charge sharing phenomenon will now be described in detail with respect to FIGS. 6–8. With reference to FIG. 6, an arbitrary mousetrap logic gate 600 in accordance with FIG. 1 is shown having an arming mechanism 608, an inverting buffer mechanism 612, and ladder logic 610, which comprises an arbitrary logic evaluation configuration. Moreover, the mousetrap logic gate 600 has various input vector components <a-h>, which can define whole vectors, partial vectors, or both, and an output vector component <o>, which constitutes part of a larger output vector O=<..., o, ...>.

In order to understand the charge sharing phenomenon, it is important to understand the intrinsic capacitances which develop during transient operation of the dynamic logic gate 600 and their relationships to each other. When the arming mechanism 608 precharges the inverting buffer input 616 of the inverting buffer mechanism 612, a storage capacitance $C_s$, denoted by reference numeral 618, is exhibited between the inverting buffer input 616 and ground.

Furthermore, as logic evaluations are performed on the input vector components <a-h>, nodes adjoining transistors can exhibit parasitic capacitances $C_p$ between the adjoining node and ground if charge is deposited on the nodes. For example, as shown in FIG. 6, at a node 620 adjoining transistors 622, 624, a parasitic capacitance $C_{p1}$ is exhibited between the node 620 and ground after the transistor 622 is turned on by a logic high vector component <a>. Essentially, part of the precharge on inverting buffer input 616 is placed on the node 620. As another example, at a node 630 adjoining transistors 624, 626, a parasitic capacitance $C_{p2}$ is exhibited between the node 630 and the ground after the transistors 622, 624 are turned on.

In addition, because of the inherent design of field effect transistors, the nodes adjoining transistors are not permitted to transgress lower than −0.6 volts, and therefore, the phenomenon can be modeled with a diode D between each adjoining node and ground. Thus, FIG. 6 shows diodes $D_1$–$D_4$ at respective adjoining nodes 620, 630, 640, 650. The phenomenon is similar to the effects of a charge pump.

Finally, other intrinsic "overlap" capacitances reside in field effect transistors when a voltage source is applied to the gate. Specifically, an overlap capacitance $C_{gs}$ arises between the gate g and the source s, and also an overlap capacitance $C_{gd}$ arises between the gate g and the drain d. The relationships between the storage capacitance $C_s$, the parasitic capacitances $C_{p1}$–$C_{p4}$, and the overlap capacitances $C_{gs}$, $C_{gd}$ will be described further below.

Figure 7:
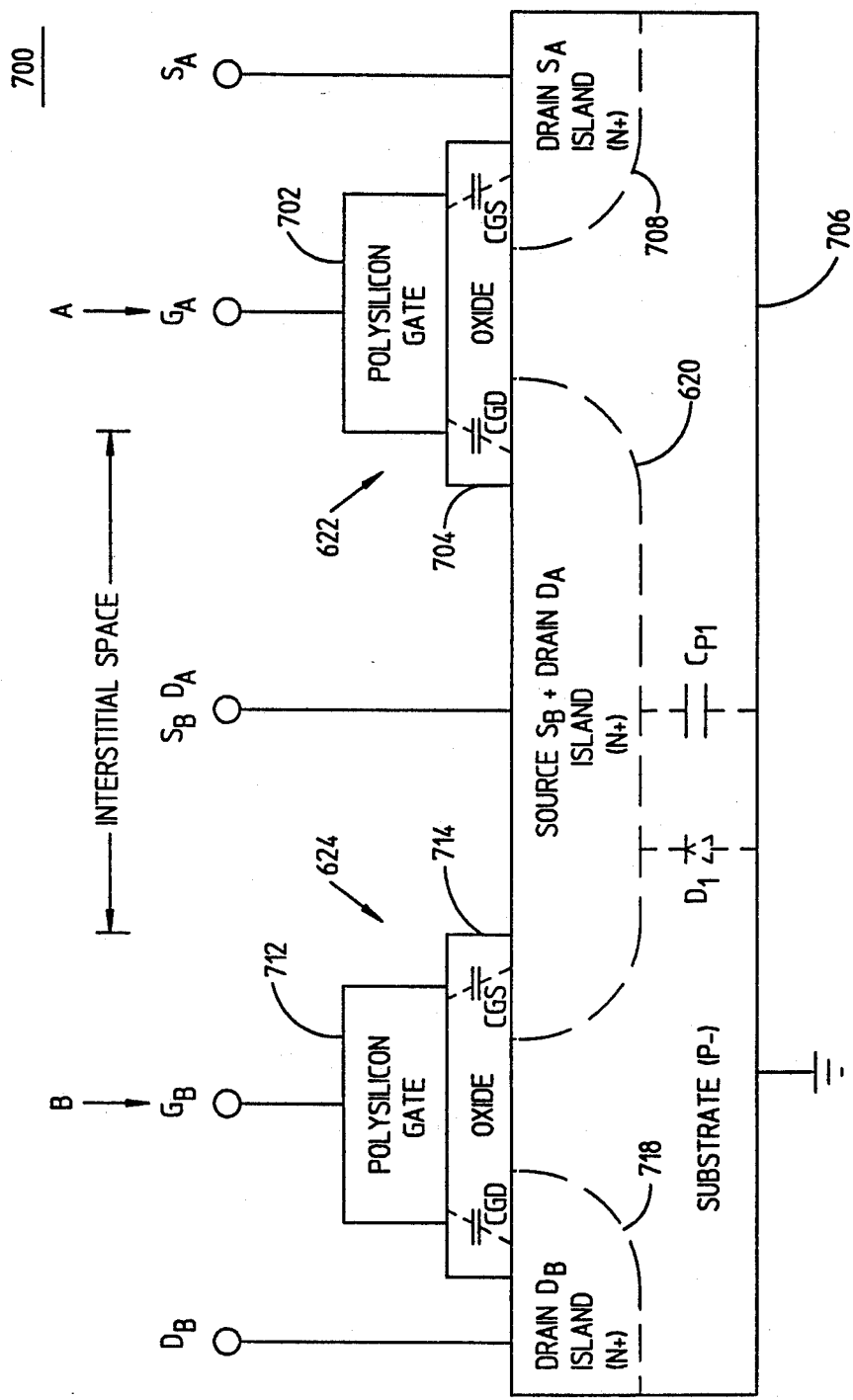
FIG. 7 shows a cross-sectional view of two field effect transistors connected in a ladder-like manner so that the source of one transistor and the drain of the other share a common island (n+) in the substrate.

In order to better understand the origin of the foregoing capacitances, a cross-sectional view of the transistors 622, 624, for example, is illustrated in FIG. 7. Each of the transistors 622, 624 comprises a respective polysilicon gate 702, 712 bonded to a respective oxide layer 704, 714 which is bonded to a common p-type substrate 706. Because the transistors 622, 624 are connected in a ladder-like manner, they can share a common interconnect n-type island (node 620 in FIG. 6) in the substrate 706, as shown, or they both could have an n-type island connected via an interconnect layer. In this example, the drain $d_a$ corresponding to the transistor 622, having input vector component <a>, shares an island 620 with the source $s_b$ corresponding with the transistor 624, having input vector component <b>.

As further shown in FIG. 7, the transistors 622, 624 exhibit intrinsic overlap capacitances as a result of the corresponding oxide layers 704, 714. For instance, the transistor 622 exhibits (1) the overlap capacitance $C_{gs}$ between the polysilicon gate 702 and respective source island 708 and (2) the overlap capacitance $C_{gd}$ between the polysilicon gate 702 and the common island 620. Additionally, FIG. 7 illustrates the parasitic capacitance $C_{p1}$ and the diode $D_1$ exhibited between the island 620 and the ground through the substrate 706.

Worth mentioning is that the overlap capacitances $C_{gs}$, $C_{gd}$ are proportional to the ratio of the oxide layer area divided by the oxide layer thickness. The oxide layer area for overlap is small, but the oxide layer thickness is even smaller, so that the overlap capacitances can be significant in some circumstances. However, in general, the overlap capacitances $C_{gs}$, $C_{gd}$ of transistors at an adjoining node are not significant enough to counterbalance the adverse effect of the corresponding parasitic capacitance $C_p$ at the adjoining node. The parasitic capacitance $C_p$ is even greater if the transistors 622, 624 are connected via an electrical connection because a significant amount of island is usually required to afford a contact to a metal interconnect layer which wires the transistors 622, 624 in the desired ladder-like manner.

Figure 8A:
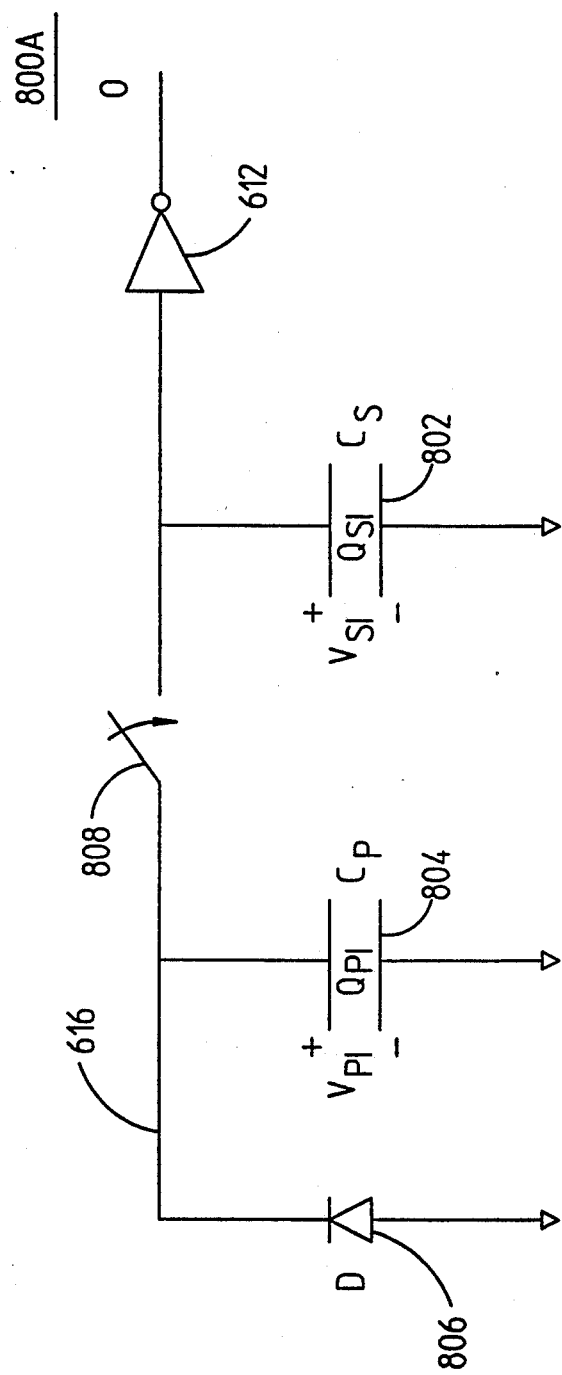
FIG. 8 illustrates the charge sharing phenomenon which is characteristic of the mousetrap gate of FIG. 6.
Figure 8B:
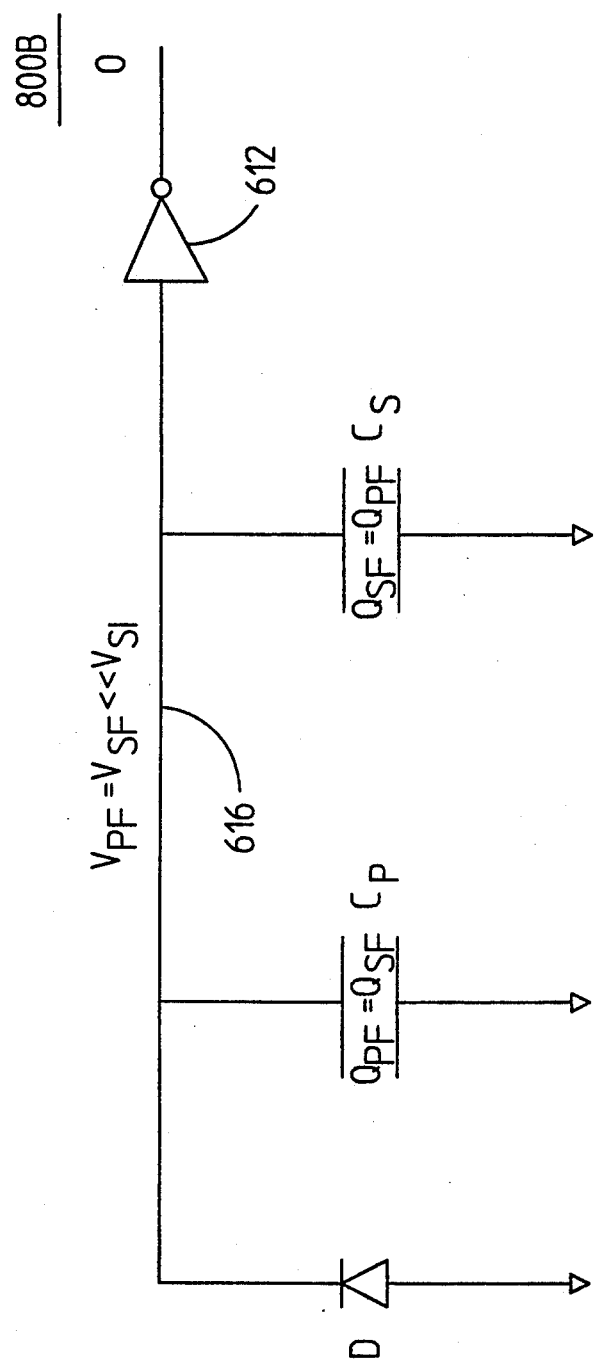

The charge sharing phenomenon will now be described with reference to FIGS. 8A and 8B. FIGS. 8A and 8B show the storage capacitance $C_s$ exhibited at the inverting buffer input 616. They show the parasitic capacitance $C_p$ ($C_p=C_{p1}+C_{p2}+C_{p3}+C_{p4}$) exhibited at adjoining nodes. Finally, they show the diode D (representing $D_1$–$D_4$) which prevents the parasitic capacitance $C_p$ from transgressing below −0.6 volts.

Initially, as shown in FIG. 8A, a storage charge $Q_{si}$ resides on the storage capacitance $C_s$, where $Q_{si}=C_s * V_{si}$. After one or more of the transistors 622-628 in the ladder logic 610 are turned on, a parasitic charge $Q_{pi}$ resides on the parasitic capacitance $C_p$, where $Q_{pi}=C_p * V_{pi}$. FIG. 8B shows that after each transistor is switched on in the ladder logic 610, the final storage charge $Q_{sf}$ on the storage capacitance $C_s$ equals the final parasitic charge $Q_{pf}$ on the parasitic capacitance $C_p$. Accordingly, the final storage capacitance voltage $V_{sf}$ at the inverting buffer input 616 is much less than the initial storage capacitance voltage $V_{si}$. As more and more of the transistors 622-628 are turned on, the parasitic capacitance $C_p$ increases, and more storage charge $Q_{si}$ flows from the storage capacitor $C_s$ to the parasitic capacitance $C_p$. As a consequence, the inverting buffer mechanism 612 may be unintentionally triggered. This adverse predicament is even more likely when the inverting buffer mechanism 612 has ratioed MOSFET widths, i.e., PMOSFET width greater than NMOSFET width.

Figure 9:
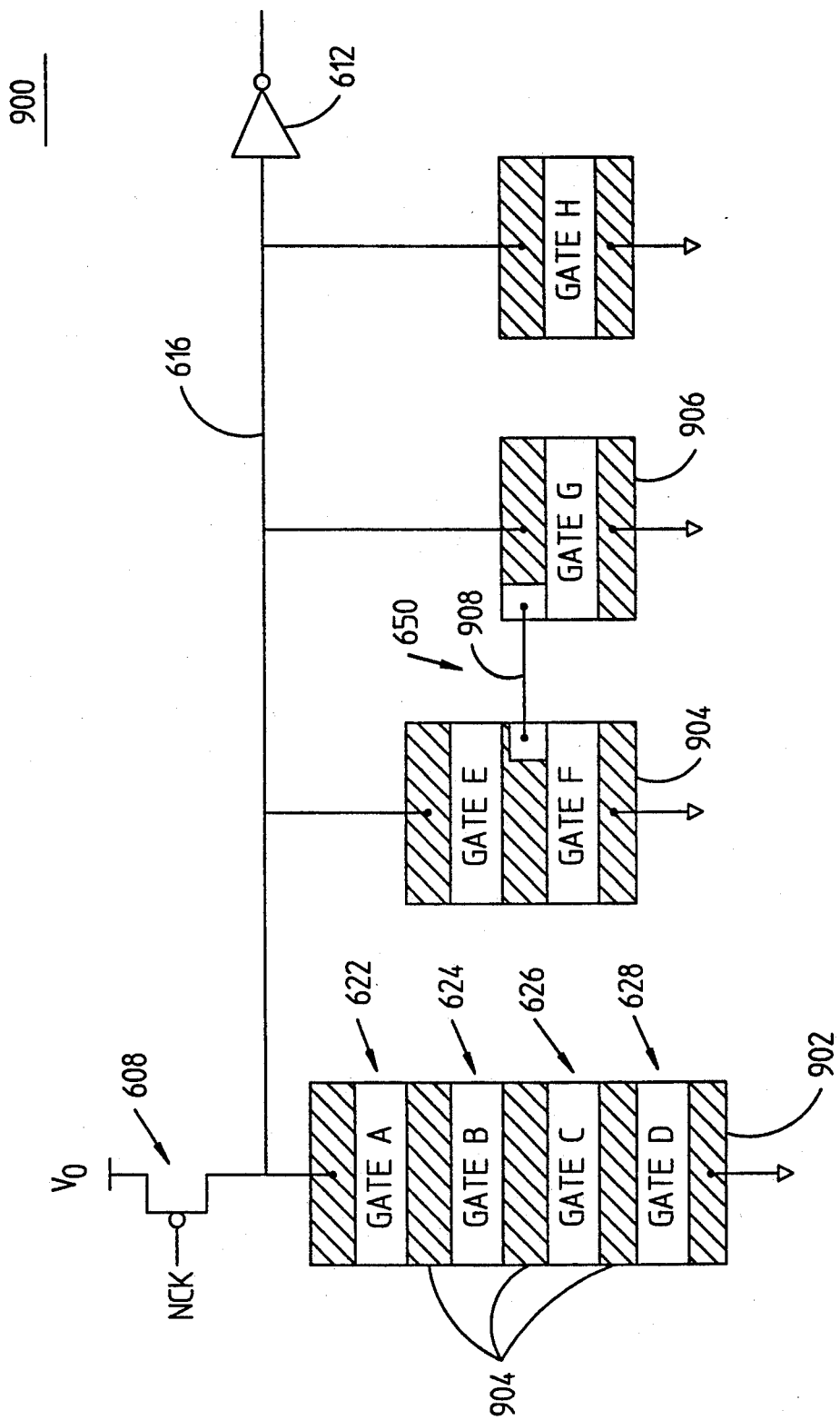
FIG. 9 shows the mousetrap gate of FIG. 6 with top view layouts of the various transistor gates for a discussion of the first embodiment of the present invention.

A first embodiment of the present invention for solving the charge sharing problem involves manipulating the manner in which the transistor gates are laid out on the substrate 706. For this discussion, FIG. 9 is presented. FIG. 9 shows a top view layout of the various transistors in the ladder logic 610.

As shown in FIG. 9, the transistor gates a–d corresponding with transistors 622-628 are laid out on a substrate 902 adjacent one another in a close parallel relationship so that the transistor gates are separated by a small interstitial space 904. The transistors 622-628 are connected by small interconnect islands situated in the substrate 902 within the interstitial space 904. No electrical connections are utilized since this configuration would necessarily require large islands for interconnects, thereby increasing the parasitic capacitance. By reducing the interstitial space and by avoiding the use of electrical connections, the parasitic capacitances $C_{p1}$–$C_{p3}$ are minimized. Consequently, charge sharing of the precharge on the inverting buffer input 616 is reduced, thereby minimizing the chance of an erroneous triggering of the dynamic gate.

The remaining embodiments of the present invention are directed to "converging" nodes of the ladder logic 610. Converging nodes reside where more than one electrical path leading from the inverting buffer input 616 to ground converge at a point. A simple example of this concept is shown at a converging node 650 in FIG. 6, where three transistors 632, 634, 636 are connected together. Converging nodes reside in the ladder logic 610 when logic paths share transistor hardware, which is often desirable to reduce expense and computer real estate.

B. Second Embodiment

The second embodiment of the present invention is directed to the physical layout of converging nodes, for example, the converging node 650. To understand the second embodiment, it is important to understand the conventional layout of a converging node. In this regard, as shown in FIG. 9, transistor gates e, f corresponding to transistors 632, 634 are configured on a common substrate 904, while the transistor gate g corresponding to transistor 636 is associated with a separate substrate 906. The converging node 650 is effectuated by an electrical connection 908, as shown.

Figure 10:
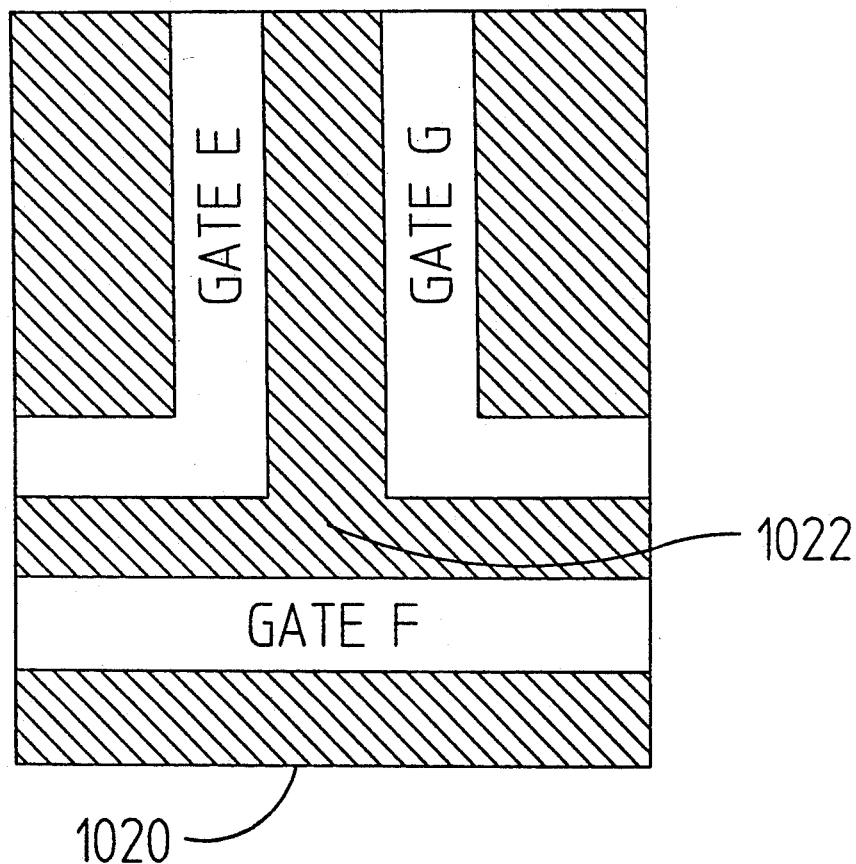
FIG. 10 shows a second embodiment of the present invention wherein a common interstitial space exhibits a T-like configuration.

In accordance with the second embodiment of the present invention, the transistor gates e, f, g are configured on a single substrate 1020 as illustrated in FIG. 10. Transistor gates e, g are oriented in a non-linear "L" manner and positioned near the linear gate f. In essence, a region of each gate lies adjacent to a region of the other two remaining gates. Further, the interstitial space 1022 are adjusted to exhibit a T-like configuration. As a result, the parasitic capacitance $C_{p4}$ at the converging node 650 is minimized.

Figure 10A:
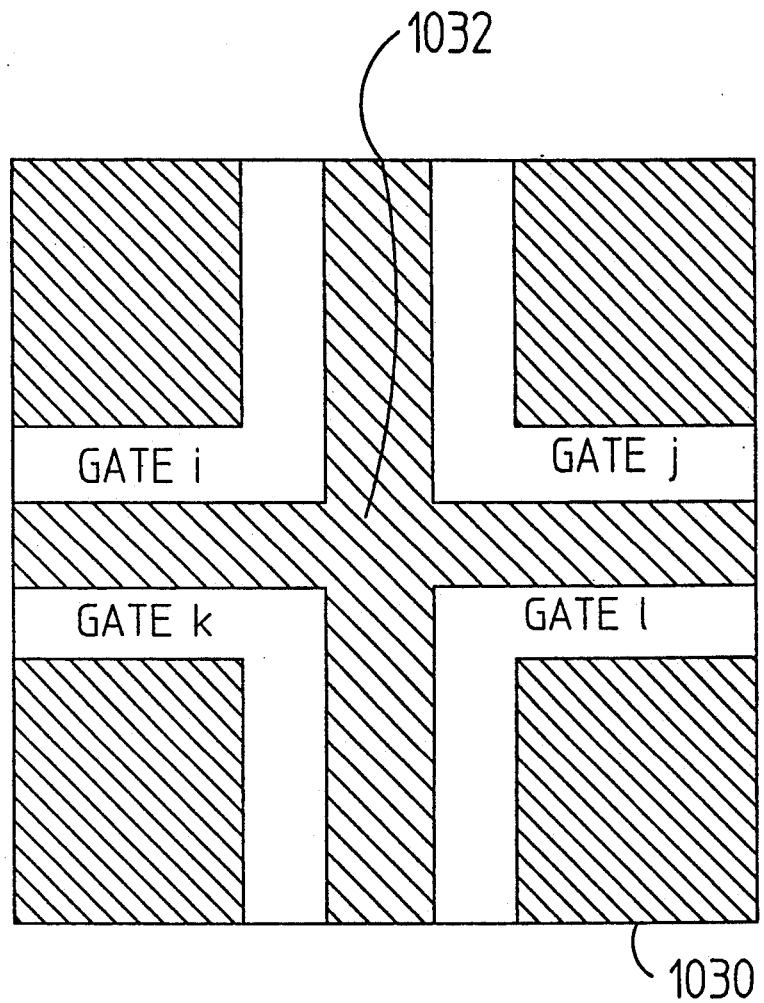
FIG. 10A shows the second embodiment of the present invention wherein a common interstitial space exhibits a cross-like configuration.

Worth noting is that the principles in regard to the second embodiment can be extended to apply to converging nodes having any number of converging electrical paths between the inverting buffer input 616 and ground. In other words, more than three transistor gates could be laid out in such a way that all transistors could be connected by a common island. For example, as illustrated in FIG. 10A, four transistors could be laid out on a single substrate 1030 so that all of their corresponding transistor gates i, j, k, l are configured in a non-linear "L" manner so that the interstitial space 1032 resembles a cross pattern.

C. Third Embodiment

Figure 11:
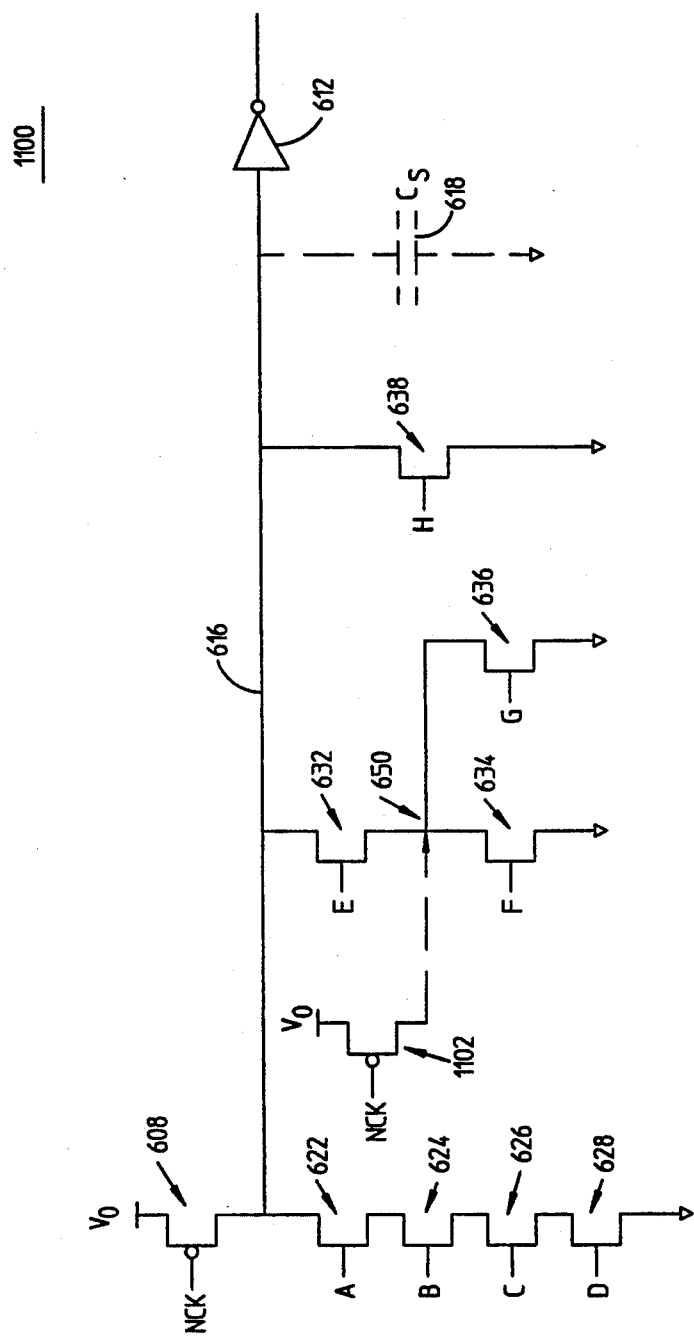
FIG. 11 shows a third embodiment of the present invention.

A third embodiment of the present invention is shown in FIG. 11. In order to minimize the parasitic capacitance $C_{p4}$ at the converging node 650, a novel precharger 1102 is connected to the converging node 650 for precharging the node 650 when the inverting buffer input 616 is precharged by the arming mechanism 608. Essentially, the precharger 1102 places charge on the intrinsic overlap capacitances $C_{gs}$, $C_{gd}$ corresponding with the three transistors 632-636, which counterbalances the effect of the parasitic capacitance $C_{p4}$ at the converging node 650 by raising the voltage potential of the node 650.

In the preferred embodiment, a PMOSFET is utilized as the precharger 1102 so that the precharger 1102 can be triggered concurrently with the arming mechanism 608 via the same clock NCK. However, an NMOSFET may be utilized if triggered by clock CK and may be more desirable in certain circumstances. An NMOSFET will not pull the converging node 650 entirely to the rail voltage $V_0$, as would a PMOSFET, because of the requisite bias voltage $V_{bias}$ ($V_{bias} = V_{gd} - V_{gs}$) associated with the NMOSFET. Worth noting is that the precharger 1102 can easily be connected to the electrical connection 908 at the converging node 650, as shown in FIG. 9.

D. Fourth Embodiment

Figure 12:
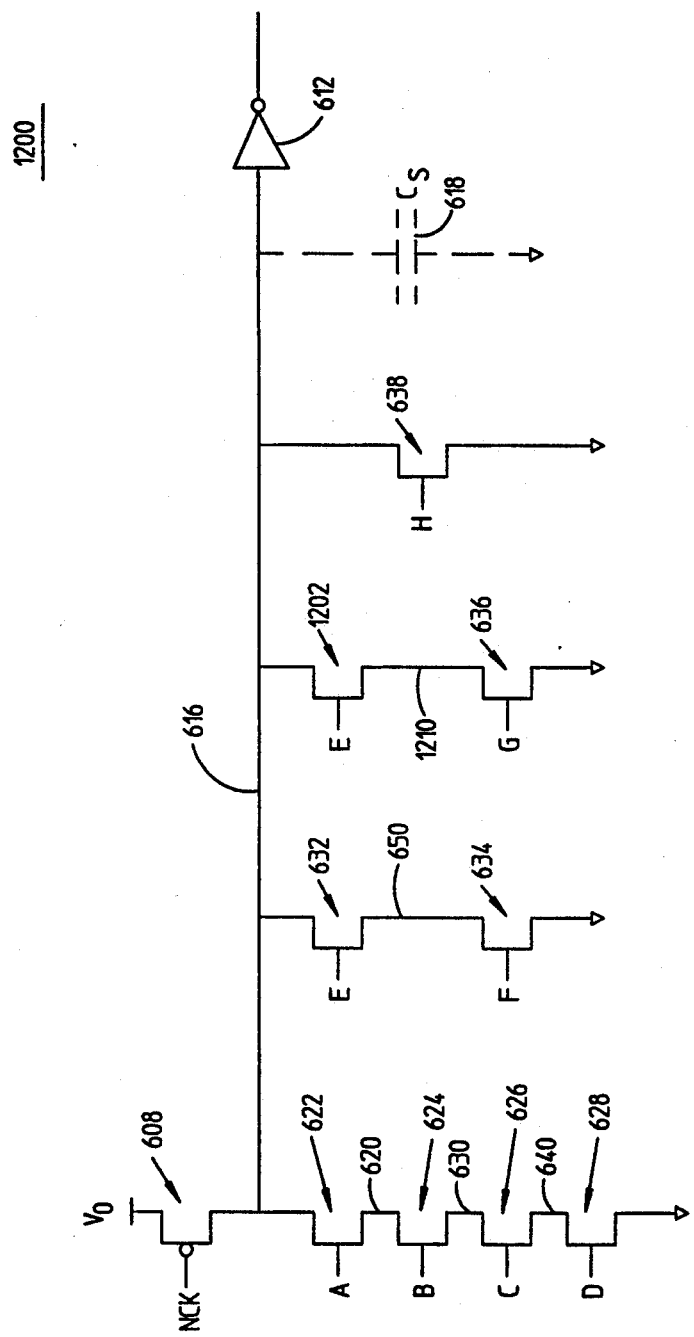
FIG. 12 shows a fourth embodiment of the present invention.

As a fourth embodiment of the present invention, the transistors of the ladder logic 610 are all configured in a ladder-like manner exclusively, as shown in FIG. 12, so as to minimize charge sharing. In the configuration illustrated in FIG. 12, the plurality of ladder logic transistors define only a plurality of mutually exclusive electrical paths to the ground.

In accordance with the fourth embodiment, converging electrical paths leading from the inverting buffer input 616 to ground are avoided by implementing redundant transistors. In other words, hardware is not shared. As an example, the converging node 650 has been eliminated in FIG. 12 by implementing a transistor 1202 for accepting a redundant input vector component e. The logic performed on data by the critical logic path remains the same, but the nature of the transient electrical characteristics is much different.

Additionally, if the parasitic capacitance $C_p$ at any of the adjoining nodes must be reduced to a greater extent, then the interstitial space between the corresponding transistor gates is reduced in accordance with the first embodiment of the present invention so as to reduce charge sharing.

The foregoing description of the preferred embodiments has been presented for purposes of illustration and description. It is not intended to be exhaustive or to limit the present invention to the precise forms disclosed, and obviously many modifications are possible in light of the above teachings.

Wherefore, we claim the following inventions:

1. A system for mitigating the adverse effects of charge sharing in dynamic logic gates by manipulating the physical layout of transistors, the system comprising:
   an inverting buffer means for providing a gate output;
   an arming means for precharging the inverting buffer input of said inverting buffer means;
   logic means for receiving a gate input and for discharging said inverting buffer input to ground, said logic means having a plurality of transistors connected in ladder-like manner and having at least three converging transistors which converge at a node, said converging transistors configured on a substrate with a common interstitial space so that a region of each transistor gate is adjacent a region of two of the other remaining transistor gates.

2. The system of claim 1, wherein three transistors converge at said node, said three transistors configured on said substrate so that said common interstitial space exhibits a T-like configuration.

3. The system of claim 1, wherein four transistors converge at said node, said four transistors configured on said substrate so that said common interstitial space exhibits a cross-like configuration.

4. A mousetrap logic gate comprising the system of claim 3.

5. A method for mitigating the adverse effects of charge sharing in a dynamic logic gate having an inverting buffer means for providing a gate output, an arming means for precharging the inverting buffer input of said inverting buffer means, and a logic means for receiving a gate input and for discharging said inverting buffer input to ground, said logic means having a plurality of field effect transistors connected in ladder-like manner, the method comprising the steps of:
   implementing said inverting buffer means by employing a CMOSFET inverter having a PMOSFET with a PMOSFET width and an NMOSFET with an NMOSFET width;
   producing the CMOSFET inverter with said PMOSFET width greater than said NMOSFET width so that said gate output switches faster from a first logic state to a second logic state than from said second logic state to said first logic state;
   disposing a precharging mechanism at a node in said logic means where logic signal paths directed to ground converge; and
   connecting said precharging mechanism within said dynamic logic gate so that said node is precharged when said inverting buffer input is precharged by said arming means.

6. A method for mitigating the adverse effects of charge sharing in a dynamic logic gate having an inverting buffer means for providing a gate output, an arming means for precharging the inverting buffer input of said inverting buffer means, and a logic means for receiving a gate input and for discharging said inverting buffer input to ground, said logic means having a plurality of field effect transistors connected in ladder-like manner, the method comprising the steps of:
   implementing said inverting buffer means by employing a CMOSFET inverter having a PMOSFET with a PMOSFET width and an NMOSFET with an NMOSFET width;
   producing said CMOSFET inverter with said PMOSFET width greater than said NMOSFET width so that said gate output switches faster from a first logic state to a second logic state than from said second logic state to said first logic state; and
   connecting only mutually exclusive logic signal paths to ground within said logic means.

7. The method of claim 6, further comprising the step of situating in close proximity transistor gates so that parasitic capacitance is minimized.

8. A system for mitigating the adverse effects of charge sharing in dynamic logic gates, the system comprising:
   an inverting buffer means for providing a gate output, said inverting buffer means comprising a CMOSFET inverter, where the PMOSFET width is greater than the NMOSFET width so that a CMOSFET inverter output switches faster from a first logic state to a second logic state than from said second logic state to said first logic state;
   an arming means for precharging an inverting buffer input of said inverting buffer means;
   logic means for receiving a gate input and for discharging said inverting buffer input to ground, said logic means having a plurality of transistors connected in ladder-like manner and having logic signal paths to ground which converge at a node; and
   a precharging means for precharging said node when said inverting buffer input is precharged by said arming means.

9. The system of claim 8, wherein said precharging means comprises a PMOSFET switched concurrently with said arming means.

10. The system of claim 8, wherein said precharging means comprises an NMOSFET switched concurrently with said arming means.

11. The system of claim 8, wherein said precharging means is connected to a common substrate shared by at least three converging transistors which converge at said node so that a region of each transistor gate is adjacent a region of each of the other remaining transistor gates.

12. A mousetrap logic gate comprising the system of claim 8.

13. A system for mitigating the adverse effects of charge sharing in dynamic logic gates, the system comprising:
   an inverting buffer means for providing a gate output, said inverting buffer means comprising a CMOSFET inverter where the PMOSFET width is greater than the NMOSFET width so that the CMOSFET inverter output switches faster from a first logic state to a second logic state than from said second logic state to said first logic state;
   an arming means for precharging an inverting buffer input of said inverting buffer means; and
   logic means for receiving a gate input and for discharging said inverting buffer input to ground, said logic means having a plurality of transistors connected in ladder-like manner only, thereby defining a plurality of mutually exclusive paths to ground.

14. The system of claim 13, wherein transistor gates of said plurality of said transistors are situated in close proximity so that parasitic capacitance is minimized.

15. A mousetrap logic gate comprising the system of claim 13.

16. A method for mitigating the adverse effects of charge sharing in dynamic logic gates by manipulating the physical layout of transistors, the dynamic logic gates having an inverting buffer means for providing a gate output, an arming means for precharging the inverting buffer input of said inverting buffer means, and a logic means for receiving a gate input and for discharging said inverting buffer into ground, said logic means having a plurality of field effect transistors connected in a ladder-like manner, the method comprising the steps of:
identifying a node in said logic means where at least three of said transistors converge; and
configuring said at least three transistors on a substrate with a common interstitial space so that a region of each transistor gate is adjacent a region of two other remaining transistor gates.

17. The method of claim 16, further comprising the step of forming a T-like configuration with said common interstitial space.

18. The method of claim 16, further comprising the step of forming a cross-like configuration with said common interstitial space.

19. The method of claim 16, further comprising the step of forming said common interstitial space in a mousetrap logic gate.

20. A system for mitigating the adverse effects of charge sharing in dynamic logic gates, the system comprising:
an inverting buffer means for providing a gate output, said inverting buffer means comprising a CMOSFET inverter, said CMOSFET inverter having a PMOSFET with a PMOSFET width and an NMOSFET with an NMOSFET width, said PMOSFET width being greater than said NMOSFET width so that said gate output switches faster from a first logic state to a second logic state than from said second logic state to said first logic state;
an arming means for precharging an inverting buffer input of said inverting buffer means;
logic means for receiving a gate input and for discharging said inverting buffer input to ground, said logic means having a plurality of transistors connected in ladder-like manner and having logic signal paths to ground which converge at a node; and
a precharging means for precharging said node when said inverting buffer input is precharged by said arming means, said precharging means being connected to a common substrate shared by at least three converging transistors which converge at said node, said common substrate separating gates of said at least three transistors so that each gate is adjacent to two other gates of the remaining transistors of said at least three transistors.

21. The system of claim 20, wherein said common substrate exhibits a T-like configuration.

22. The system of claim 20, wherein said common substrate exhibits a cross-like configuration.

23. A logic gate for a self-timed monotonic logic progression utilizing vector logic variables, each vector logic variable defined by vector components on respective logic paths, each vector logic variable exhibiting either an invalid state or a unique one of a plurality of possible valid states at an instant in time, said invalid state exhibited when all of said logic paths exhibit a logic low, each of said valid states exhibited when a subset of said logic paths exhibit a logic high, the logic gate for deriving an output vector from input vectors, the logic gate for mitigating the adverse effects of charge sharing by manipulating the physical layout of transistors, comprising:
logic means comprising a plurality of ladder logic mechanisms, said logic mechanisms for receiving said input vectors, for performing logic functions upon said input vectors, and for providing a ladder logic output at a ladder logic;
buffer means comprising a plurality of inverting buffer mechanisms associated respectively with said ladder logic mechanisms, said inverting buffer mechanisms configured to output corresponding vector components defining said output vector, said inverting buffer means for maintaining said vector components at a logic low before receiving said ladder logic outputs so that said output vector exhibits said invalid state, one of said inverting buffer mechanisms configured to receive said vector logic output and invert said ladder logic output to thereby derive said output vector in said valid state;
arming means comprising a plurality of arming mechanisms associated respectively with said inverting buffer mechanisms, said arming mechanisms configured to periodically precharge said inverting buffer mechanisms respectively to thereby cause said inverting buffer mechanisms to maintain said vector components at said logic low; and
said logic means having at least three transistors situated on a substrate with a common interstitial space separating their gates so that each gate is adjacent to two other gates of the remaining transistors.

24. The system of claim 23, wherein three transistors converge at said node, said three transistors configured on said substrate so that said common interstitial space exhibits a T-like configuration.

25. The system of claim 23, wherein four transistors converge at said node, said four transistors configured on said substrate so that said common interstitial space exhibits a cross-like configuration.

26. The system of claim 23, wherein said inverting buffer mechanisms each comprise a CMOSFET inverter having a CMOSFET output which switches faster from a logic low to a logic high than from a logic high to a logic low.

27. The system of claim 23, wherein said logic means further comprises another node where a plurality of transistors connected in a ladder-like manner converge, and further comprising a precharging means for precharging said another node when said inverting buffer mechanisms are precharged by said arming mechanisms.

28. The system of claim 27, wherein said precharging means comprises a PMOSFET which is switched when said arming mechanisms precharge said inverting buffer mechanisms.

29. The system of claim 27, wherein said precharging means comprises a NMOSFET which is switched when said arming mechanisms precharge said inverting buffer mechanisms.

30. A method for mitigating the adverse effects of charge sharing in dynamic logic gates by manipulating the physical layout of transistors, the method comprising the steps of:
providing a dynamic logic gate having an inverting buffer means for providing a gate output, an arming means for precharging the inverting buffer input of said inverting buffer means, and a logic means for receiving a gate input and for discharging said inverting buffer, said logic means having a plurality of transistors; and forming gate regions which correspond to at least three transistors on a substrate so that said gate regions are separated by a common interstitial space and so that each of said gate regions is adjacent to two other gate regions.

31. The method of claim 30, further comprising the step of forming a T-like configuration with said common interstitial space.

32. The method of claim 30, further comprising the step of forming a cross-like configuration with said common interstitial space.

33. The method of claim 30, further comprising the step of disposing a precharging means at another node in said logic means where transistors converge, said precharging means for precharging said another node when said inverting buffer input is precharged by said arming means.

34. The method of claim 30, further comprising the step of implementing said inverting buffer means with a CMOSFET inverter having a PMOSFET width which is greater than an NMOSFET width so that said CMOSFET inverter switches quicker from a first logic state to a second logic state than from said second logic state to said first logic state.

* * * * *